(12) United States Patent
Doi

(10) Patent No.: US 6,707,750 B2
(45) Date of Patent: Mar. 16, 2004

(54) SEMICONDUCTOR STORING DEVICE FOR READING OUT OR WRITING DATA FROM/ IN MEMORY CELLS

(75) Inventor: Yoshinori Doi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/270,691

(22) Filed: Oct. 16, 2002

(65) Prior Publication Data

US 2003/0202416 A1 Oct. 30, 2003

(30) Foreign Application Priority Data

Apr. 24, 2002 (JP) ........................................ 2002-122731

(51) Int. Cl.[7] ................................................. G11C 8/00
(52) U.S. Cl. ............................. 365/230.03; 365/230.06
(58) Field of Search ........................ 365/230.03, 230.06

(56) References Cited

U.S. PATENT DOCUMENTS 4,984,202 A * 1/1991 Kawahara et al. .......... 365/177
5,375,093 A * 12/1994 Hirano ....................... 365/222

FOREIGN PATENT DOCUMENTS

| JP | 4-195895 | 7/1992 |
| JP | 5-20173 | 1/1993 |

* cited by examiner

*Primary Examiner*—Michael Tran
(74) *Attorney, Agent, or Firm*—Burns, Doane, Swecker & Mathis, LLP

(57) ABSTRACT

A plurality of memory cells connected with word lines in a row direction and connected with bit lines in a column direction are disposed in a matrix of rows and columns, and addresses are assigned to the memory cells to consecutively increase the address in the row direction in each row. The memory cells are positioned in a plurality of memory cell blocks respectively corresponding to a group of columns. A first specific word line is selected in one memory cell block or more of a high address side, and a second specific word line corresponding to an address group, which is higher than that of the first specific word line and is nearest to that of the first specific word line among those of the word lines, is selected in the remaining memory cell block or more of a low address side.

20 Claims, 12 Drawing Sheets

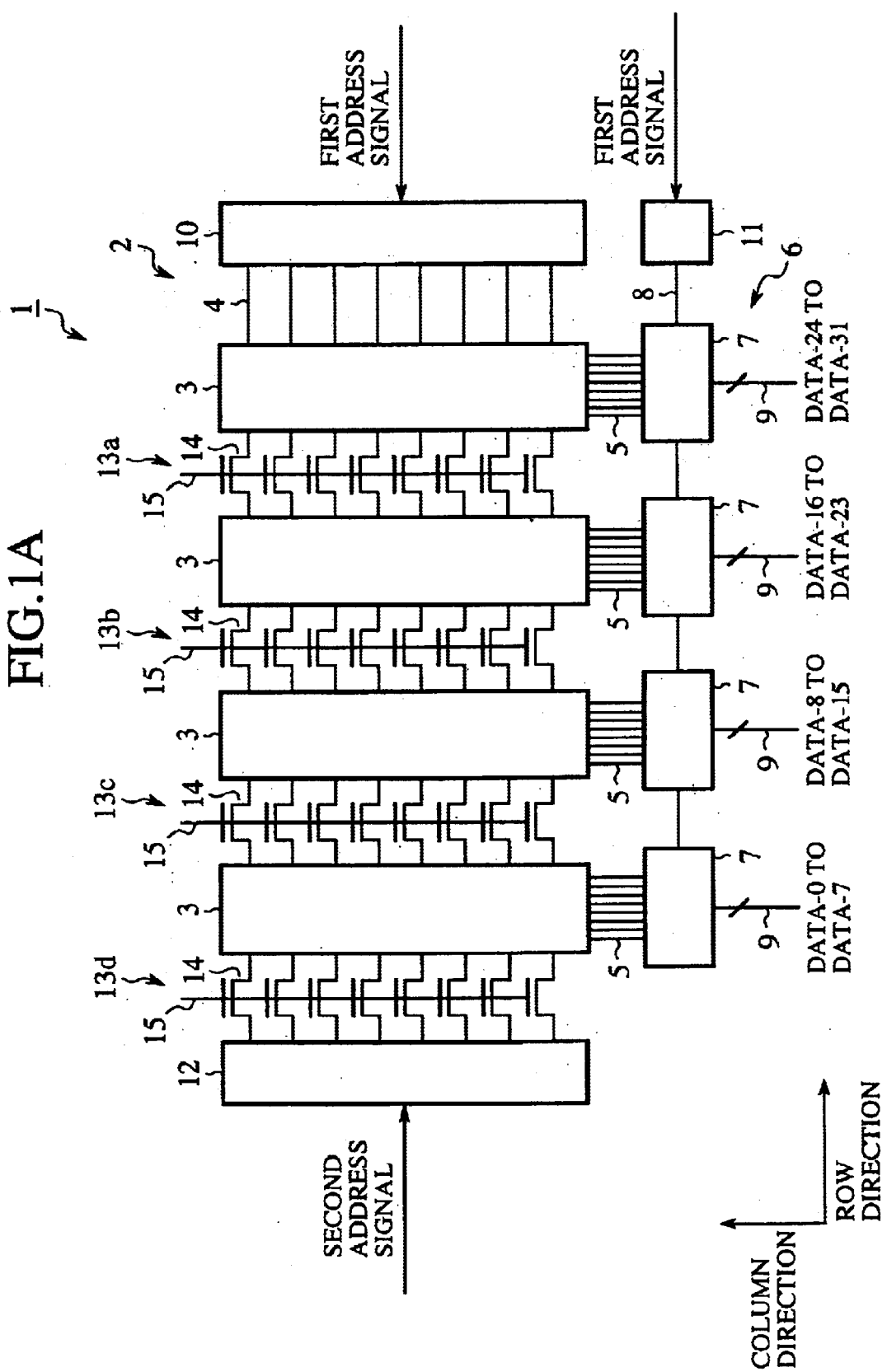

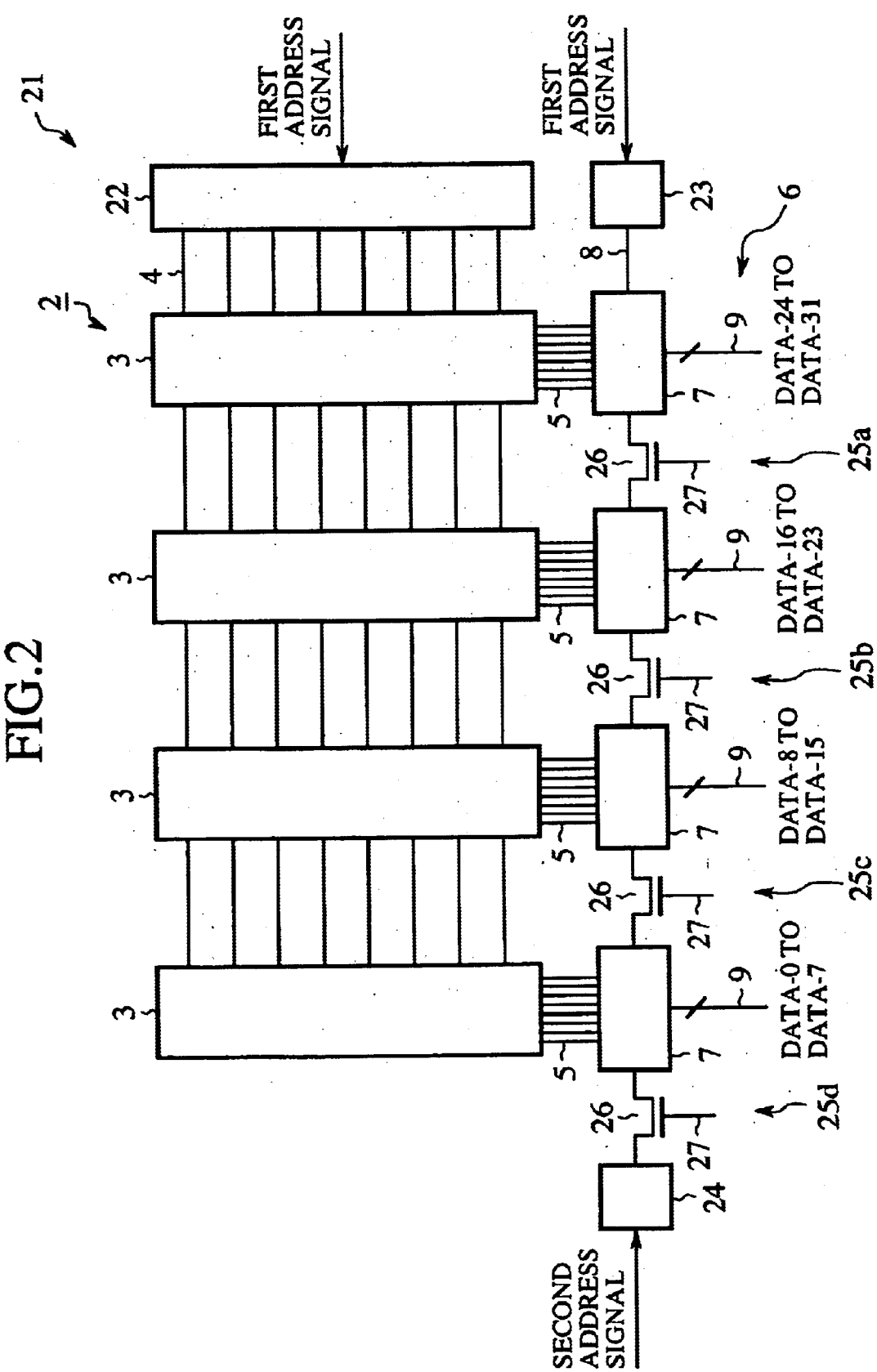

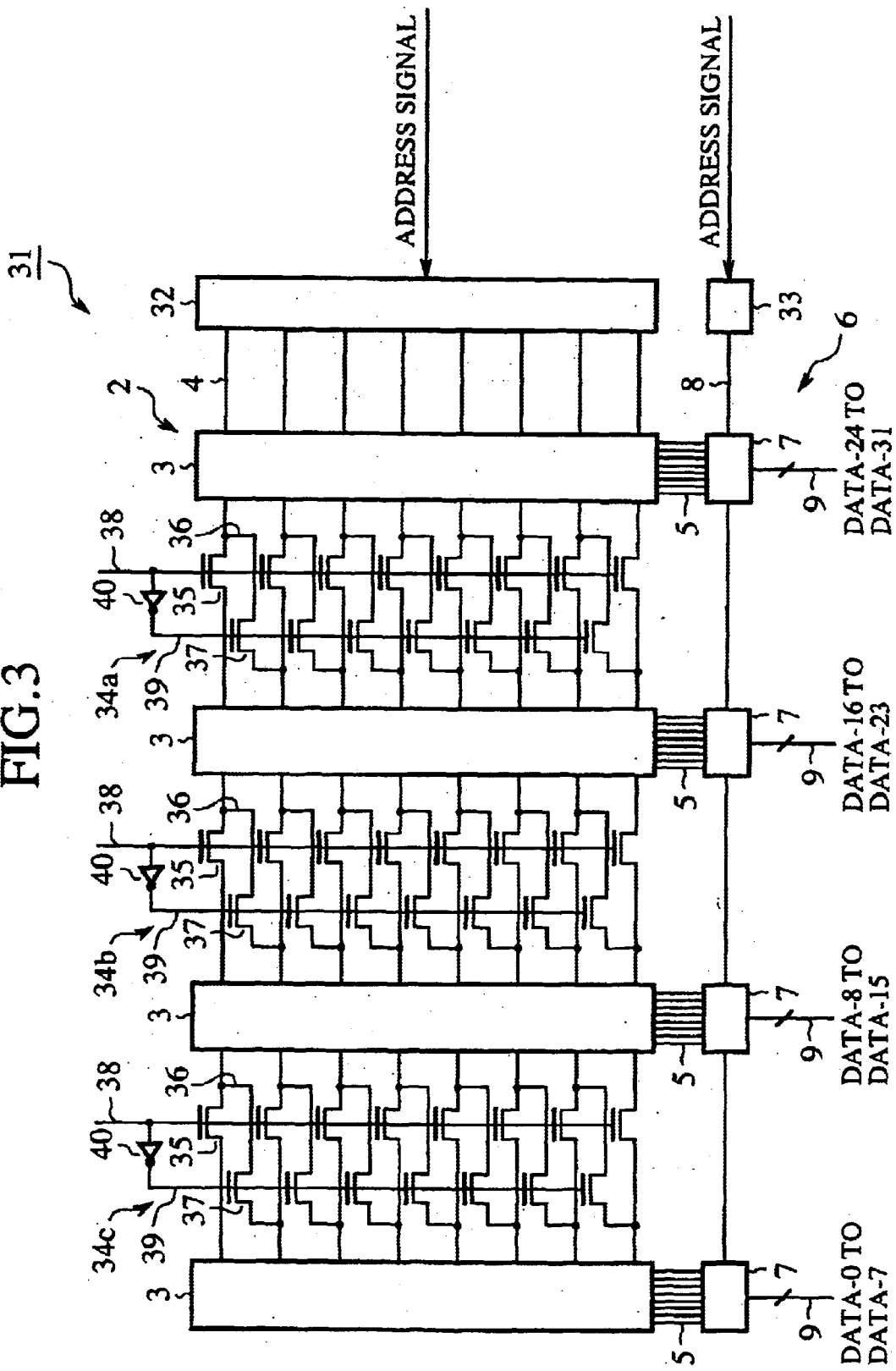

sponding to each bit select line 108. For example, the
SEMICONDUCTOR STORING DEVICE FOR READING OUT OR WRITING DATA FROM/ IN MEMORY CELLS

BACKGROUND OF THE INVENTION

1. Field of the Invention

The present invention relates to a semiconductor storing device for reading out or writing data corresponding to a bit width of a memory cell array from/in a plurality of memory cells of the memory cell array.

2. Description of Related Art

FIG. 9 is a block diagram showing the configuration of a conventional semiconductor storing device. In FIG. 9, 101 indicates a conventional semiconductor storing device. 102 indicates a memory cell array in which a plurality of memory cells 103 are disposed in a matrix of 8 rows and 64 columns. 104 indicates each of a plurality of word lines. Each word line 104 is connected with the memory cells 103 placed in the same row. The number of word lines 104 disposed in the conventional semiconductor storing device 101 is equal to eight, and each word line 104 is connected with the sixty-four memory cells 103. 105 indicates each of a plurality of bit lines. Each bit line 105 is connected with the memory cells 103 placed in the same column. The number of bit lines 105 disposed in the conventional semiconductor storing device 101 is equal to sixty-four, and each bit line 105 is connected with the eight memory cells 103. 106 indicates a bit selector array.

107 indicates each of a plurality of bit selectors. The bit selector arrays 107 are disposed in the bit selector array 106, the number of bit selector arrays 107 is equal to thirty-two, and each bit selector 107 corresponds to the memory cells 103 of two columns adjacent to each other. Therefore, each bit selector 107 is connected with two bit lines 105, and one of the two bit lines 105 is selected in the bit selector 107 according to a signal transmitted through a bit select line 108. Data-N denoting one-bit data ("0" or "1") represents each of data-0, data-1, data-2, . . . , and data-31, and the one-bit data-N is input to or output from each bit selector 107. In other words, the memory cell array 102 has a bit width of 32 bits, and 32-bit data is read out or written from/in the thirty-two memory cells 103 of the memory cell array 102 every read or write operation.

108 indicates each of two bit select lines. Each bit select line 108 is connected with the thirty-two bit selectors 107. In FIG. 9, only one bit select line 108 is shown for convenience. The bit select lines 108 relate to two bit lines 105 in one-to-one correspondence in the bit selectors 107.

109 indicates a row address decoder connected with one end of each word line 104. A row address signal included in an address signal is input from the outside to the row address decoder 109, and one word line 104 is selected in the row address decoder 109 according to the row address signal. 110 indicates a column address decoder connected with one end of each bit select line 108. A column address signal included in the address signal is input from the outside to the column address decoder 110, and one bit select line 108 is selected in the column address decoder 110 according to the column address signal.

FIG. 10 is a view showing a first addressing arrangement in which addresses are assigned to the memory cells 103 of the memory cell array 102, and FIG. 11 is a view showing a second addressing arrangement in which addresses are assigned to the memory cells 103 of the memory cell array 102. In FIG. 10 and FIG. 11, the sixteen addresses ranging from "00" to "3F" are assigned to the memory cells 103 in the memory cell array 102, and each address is composed of eight bits corresponding to eight memory cells 103. As an example, "1A.2" denotes the second bit of the address "1A". In the examples of the address assignment shown in FIG. 10 and FIG. 11, each bit selector 106 is connected with two bit lines 105. However, the number of bit lines connected with each bit selector 106 is arbitrary.

In the first addressing arrangement shown in FIG. 10, a group of addresses assigned to one group of memory cells 103 of the bit lines 105 corresponding to each bit select line 108 in each row are increased with the change of the group of memory cells 103 in a row direction (or a right direction in FIG. 10). For example, one group of addresses "00", "01", "02" and "03" assigned to the group of memory cells 103 of the bit lines 105 (placed on the left side in each of the bit selectors 106) corresponding to one bit select line 108 in the first row (or the top row in FIG. 10) are increased to another group of addresses "20", "21", "22" and "23" assigned to the group of memory cells 103 of the bit lines 105 (placed on the right side in the bit selectors 106) corresponding to the other bit select line 108 in the first row. Also, the address is consecutively increased in the row direction in each group of memory cells 103 for each row. For example, the addresses "00", "01", "02" and "03" of the group arranged in that order in the first row are increased in the row direction. Also, the addresses of consecutive numbers are assigned to the memory cells 103 connected with the bit lines 105 corresponding to each bit select line 108. For example, the addresses "00" to "1F" of consecutive numbers are assigned to the memory cells 103 connected with the bit lines 105 (placed on the left side in each of the bit selectors 106) corresponding to one bit select line 108.

In the second addressing arrangement shown in FIG. 11, a group of addresses assigned to one group of memory cells 103 of the bit lines 105 corresponding to each bit select line 108 in each row are increased with the change of the group of memory cells 103 in the row direction. For example, one group of addresses "00", "01", "02" and "03" assigned to the group of memory cells 113 of the bit lines 105 (placed on the left side in each of the bit selectors 106) corresponding to one bit select line 108 in the first row are increased to another group of addresses "04", "05", "06" and "07" assigned to the group of memory cells 103 of the bit lines 105 (placed on the right side in the bit selectors 106) corresponding to the other bit select line 108 in the first row. Also, the address is consecutively increased in the row direction in each group of memory cells 103 for each row. For example, the addresses "00", "01", "02" and "03" of the group arranged in that order in the first row are increased in the row direction. Also, the addresses of consecutive numbers are assigned to the memory cells 103 of each row. For example, the addresses "00" to "07" of consecutive numbers are assigned to the memory cells 103 of the first row.

In case of the first addressing arrangement shown in FIG. 10, three lower bits (A2, A1, A0) of the address signal (A3, A2, A1, A0) sent from the outside are input to the row address decoder 109 as a row address signal, and the top bit (A3) of the address signal is input to the column address decoder 110 as a column address signal. In contrast, in case of the second addressing arrangement shown in FIG. 11, three upper bits (A3, A2, A1) of the address signal (A3, A2, A1, A0) sent from the outside are input to the row address decoder 109 as a row address signal, and the bottom bit (A0) of the address signal is input to the column address decoder 110 as a column address signal.

Next, an operation of the conventional semiconductor storing device 101, in which the addresses "00" to "3F" are assigned to the memory cells 103 according to the first addressing arrangement shown in FIG. 10, will be described below.

In cases where thirty-two pieces of one-bit data corresponding to the 32-bit width of the memory cell array 102 are read out from or written in thirty-two memory cells 103 placed at addresses ranging from the first address "00" to the fourth address "03" as 32-bit data, the first word line 104 placed at the top position is selected in the row address decoder 109, and the first bit select line 108 placed at the top position is selected in the column address decoder 110 to select the first bit line 105 placed at the most-left side in each bit selector 107. Therefore, data-0 of the address "00.0", data-1 of the address "00.1", data-2 of the address "00.2", . . . , data-7 of the address "00.7", data-8 of the address "01.0", . . . , data-16 of the address "02.0", . . . , data-24 of the address "03.0", . . . and data-31 of the address "03.7" are read out from or written in the thirty-two memory cells 103 placed at the addresses "00" to "03" as 32-bit data.

Accordingly, 32-bit data can be read out from or written in the memory cell array 102 every access operation in case of the first addressing arrangement.

Also, in cases where thirty-two pieces of one-bit data corresponding to the 32-bit width of the memory cell array 102 are read out from or written in thirty-two memory cells 103 placed from the second address "01" to the fifth address "04" as 32-bit data, because the top memory cell 103 placed at the top of the memory cells 103 of the second address "01" is placed in the middle of the memory cells 103 of one row, two access operations are performed. In detail, in the first access operation, the first word line 104 from the top is selected in the row address decoder 109, and the first bit select line 108 from the top is selected in the column address decoder 110 to select the first bit line 105 placed on the most-left side in each bit selector 107. Therefore, twenty-four pieces of one-bit data denoting data-8 to data-31 are read out from or written in the twenty-four memory cells 103 of the addresses "01" to "03". In this case, though eight pieces of one-bit data are undesirably read out from or written in the eight memory cells 103 of the address "00" as data-0 to data-7, these eight pieces of one-bit data are disregarded. Thereafter, in the second access operation, the second word line 104 from the top is selected in the row address decoder 109, and the first bit select line 108 from the top is again selected in the column address decoder 110 to select the first bit line 105 placed on the most-left side in each bit selector 107. Therefore, eight pieces of one-bit data denoting data-0 to data-7 are read out from or written in the eight memory cells 103 of the address "04". In this case, though twenty-four pieces of one-bit data are undesirably read out from or written in the twenty-four memory cells 103 of the addresses "05" to "07" as data-8 to data-31, these twenty-four one-bit data are disregarded. Therefore, 32-bit data is obtained by combining the twenty-four pieces of one-bit data of the first access operation and the eight pieces of one-bit data of the second access operation. In this case, too disregard the eight pieces of one-bit data in the first access operation and to disregard the twenty-four pieces of one-bit data in the second access operation, it is impossible to simultaneously perform the first access operation and the second access operation.

Accordingly, 32-bit data can be read out from or written in the memory cell array 102 every two access operations in case of the first addressing arrangement.

Next, an operation of the conventional semiconductor storing device 101, in which the addresses "00" to "3F" are assigned to the memory cells 103 according to the second addressing arrangement shown in FIG. 11, will be described below.

In cases where thirty-two pieces of one-bit data corresponding to the 32-bit width of the memory cell array 102 are read out from or written in thirty-two memory cells 103 of the addresses "00" to "03" as 32-bit data, the first word line 104 placed at the top position is selected in the row address decoder 109, and the first bit select line 108 placed at the top position is selected in the column address decoder 110 to select the first bit line 105 placed on the most-left side in each bit selector 107. Therefore, thirty-two pieces of one-bit data denoting data-0 to data-31 are read out from or written in the thirty-two memory cells 103 of the addresses "00" to "03".

Accordingly, 32-bit data can be read out from or written in the memory cell array 102 every access operation in the second addressing arrangement.

Also, in cases where thirty-two pieces of one-bit data corresponding to the 32-bit width of the memory cell array 102 are read out from or written in thirty-two memory cells 103 of the addresses "01" to "04" as 32-bit data, because the top memory cell 103 placed at the top among the memory cells 103 of the second address "01" is placed in the middle of the memory cells 103 of one row, two access operations are performed. In detail, in the first access operation, the first word line 104 placed at the top position is selected in the row address decoder 109, and the first bit select line 108 placed at the top position is selected in the column address decoder 110 to select the first bit line 105 placed on the most-left side in each bit selector 107. Therefore, twenty-four pieces of one-bit data denoting data-8 to data-31 are read out from or written in the twenty-four memory cells 103 of the addresses "01" to "03".

In this case, though eight pieces of one-bit data are undesirably read out from or written in the eight memory cells 103 of the address "00" as data-0 to data-7, these eight pieces of one-bit data are disregarded. Thereafter, in the second access operation, the first word line 104 placed at the top position is again selected in the row address decoder 109, and the second bit select line 108 from the top is selected in the column address decoder 110 to select the second bit line 105 from the left in each bit selector 107. Therefore, eight pieces of one-bit data denoting data-0 to data-7 are read out from or written in the eight memory cells 103 of the address "04". In this case, though twenty-four pieces of one-bit data are undesirably read out from or written in the twenty-four memory cells 103 of the addresses "05" to "07" as data-8 to data-31, these twenty-four pieces of one-bit data are disregarded. Therefore, 32-bit data is obtained by combining the twenty-four pieces of one-bit data of the first access operation and the eight pieces of one-bit data of the second access operation. In this case, too disregard the eight pieces of one-bit data in the first access operation and to disregard the twenty-four pieces of one-bit data in the second access operation, it is impossible to simultaneously perform the first access operation and the second access operation.

Accordingly, 32-bit data can be read out from or written in the memory cell array 102 every two access operations in the second addressing arrangement.

Because the conventional semiconductor storing device 101 has the above-described configuration, in cases where the memory cell 103 placed at the top among the memory cells 103 of pieces of one-bit data (for example, thirty-two pieces of one-bit data) planned to be read out or written in correspondence to the bit width (for example, 32 bits) of the memory cell array 102 is placed in the middle of the memory cells 103 of one row or is not placed at the top of one row, two access operations are required to obtain the pieces of one-bit data corresponding to the bit width of the memory cell array 102. Therefore, a problem has arisen that the read or write operation is troublesome in cases where the pieces of one-bit data corresponding to the bit width of the memory cell array 102 are read out from or written in the memory cell array 102.

SUMMARY OF THE INVENTION

An object of the present invention is to provide, with due consideration to the drawbacks of the conventional semiconductor storing device 101, a semiconductor storing device in which pieces of data corresponding to a bit width of a memory cell array are read out from or written in a plurality of memory cells of the memory cell array in one access operation even though the top memory cell placed at the top among the memory cells is placed in the middle of a row of memory cells.

The object is achieved by the provision of a semiconductor storing device including a memory cell array having a plurality of memory cells, a plurality of memory cell blocks, a plurality of word lines, a plurality of bit lines, a first row address decoder, a second row address decoder and a word line control unit.

The memory cells are disposed in a matrix of a plurality of columns respectively extending in a column direction and a plurality of rows respectively extending in a row direction from a first column position to a second column position, and a plurality of addresses are assigned to the memory cells in one-to-one correspondence. The memory cell blocks are disposed in parallel to each other in the row direction, and each memory cell block has the memory cells of a group of columns to have a prescribed bit width in the row direction. Each word line is connected with the memory cells of the memory cell array placed in one row. Each bit line is connected with the memory cells of the memory cell array placed in one column. The first row address decoder selects one word line from the word lines according to a first row address signal. The second row address decoder selects one word line corresponding to a specific address group, which is higher than an address group of the word line selected by the first row address decoder and is nearest to the address group of the word line among address groups of the word lines, from the word lines according to a second row address signal. Finally, the word line control unit controls the word line selected by the first row address decoder to be set to an active state in one memory cell block or memory cell blocks placed on the side of the second column position and controlling the word line selected by the second row address decoder, in the remaining memory cell block or the remaining memory cell blocks or no remaining memory cell block placed on the side of the first column position, to be set to an active state.

In the above configuration, the word line of the specific address group, which is higher than that of the word line selected by the first row address decoder and is nearest to that of the word line among address groups of the word lines, is selected in the second row address decoder. Thereafter, by the word line control unit, the word line selected by the first row address decoder is set to an active state in one memory cell block or memory cell blocks placed on the side of the second column position, and the word line selected by the second row address decoder is set to an active state in the remaining memory cell block or the remaining memory cell blocks or no remaining memory cell block placed on the side of the first column position. Thereafter, pieces of one-bit data are read out from or written in specific memory cells of the word lines set to the active state in one access operation. In this case, the top specific memory cell of the word line selected by the first row address decoder and set to the active state is not necessarily placed on the top position (or the first column position) of the corresponding row. Also, because the pieces of one-bit data are read out from or written in the specific memory cells of all the memory cell blocks, pieces of one-bit data corresponding to a bit width of the memory cell array (or the bit widths of all the memory cell blocks) are read out from or written in the specific memory cells.

Accordingly, even though a top memory cell placed at the top among a plurality of memory cells of pieces of one-bit data planed to be read out or written is placed in the middle of a row of memory cells, the pieces of one-bit data corresponding to a bit width of the memory cell array can be read out from or written in the memory cells of the memory cell array in one access operation.

The object is also achieved by the provision of a semiconductor storing device including the memory cell array having the memory cells, a plurality of memory cell blocks, a plurality of word lines, a row address decoder, a plurality of bit lines, a plurality of bit select lines, a first column address decoder, a second column address decoder, a plurality of bit selectors and a bit line control unit.

The memory cell blocks are disposed in parallel to each other in the row direction, and each memory cell block has the N memory cells (N denotes an integral number equal to or higher than two) for each row. Each word line is connected with the memory cells of the memory cell array placed in one row. The row address decoder selects one of the word lines according to a row address signal. Each bit line is connected with the memory cells of the memory cell array placed in one column. The bit select lines are related to the bit lines of each memory cell block in one-to-one correspondence, and the number bit select lines is equal to N. The first column address decoder selects one bit select line from the bit select lines according to a first column address signal. The second column address decoder selects one bit select line corresponding to one bit line of a specific address group, which is higher than an address group of the bit line corresponding to the bit select line selected by the first column address decoder and is nearest to the address group of the bit line among address groups of the bit lines of one memory cell block, according to a second column address signal. The bit selectors is disposed in correspondence to the memory cell blocks respectively and connected with the bit select lines, and each bit selector selects the bit line corresponding to the bit select line selected by the first column address decoder or the bit line corresponding to the bit select line selected by the second column address decoder from the bit lines of the corresponding memory cell block. Finally, the bit line control unit controls one bit selector or each of bit selectors corresponding to one memory cell block or each of memory cell blocks placed on the side of the second column position to select the bit line corresponding to the bit select line selected by the first column address decoder and controls one bit selector or each of bit selectors or no bit selector corresponding to the remaining memory cell block or each of the remaining memory cell blocks or no remaining memory cell block placed on the side of the first column position to select the bit line corresponding to the bit select line selected by the second column address decoder.

In the above configuration, the bit select line corresponding to the bit line of the specific address group, which is higher than that of the bit line corresponding to the bit select line selected by the first column address decoder and is nearest to that of the bit line among those of the bit lines of the memory cell block, is selected by the second column address decoder. Thereafter, under the control of the bit line control unit, the bit line corresponding to the bit select line selected in the first column address decoder is selected in one memory cell block or each of memory cell blocks placed on the side of the second column position, and the bit line corresponding to the bit select line selected by the second column address decoder is selected in the remaining memory cell block or each of the remaining memory cell blocks or no remaining memory cell block placed on the side of the first column position.

Accordingly, even though a top memory cell placed at the top among a plurality of memory cells of pieces of one-bit data planed to be read out or written is placed in the middle of a row of memory cells, the pieces of one-bit data corresponding to a bit width of the memory cell array can be read out from or written in the memory cells of the memory cell array in one access operation.

The object is also achieved by the provision of a semiconductor storing device including a row address decoder and a word line changing unit.

The row address decoder selects one word line from the word lines according to a row address signal. The word line changing unit sets the word line selected by the row address decoder to an active state in one memory cell block or memory cell blocks placed on the side of the second column position and changes the word line selected by the row address decoder, in the remaining memory cell block or the remaining memory cell blocks or no remaining memory cell block placed on the side of the first column position, to another word line corresponding to a specific address group, which is higher than an address group of the word line selected by the row address decoder and is nearest to the address group of the word line among address groups of the word lines, to set the changed word line to an active state.

In the above configuration, in the word line changing unit, the word line selected by the row address decoder is set to an active state in one memory cell block or memory cell blocks placed on the side of the second column position. Also, in the remaining memory cell block or the remaining memory cell blocks or no remaining memory cell block placed on the side of the first column position, the word line selected by the row address decoder is changed to another word line corresponding to a specific address group, which is higher than that of the word line selected by the row address decoder and is nearest to that of the word line among address groups of the word lines, to set the changed word line to an active state.

Accordingly, even though a top memory cell placed at the top among a plurality of memory cells of pieces of one-bit data planed to be read out or written is placed in the middle of a row of memory cells, the pieces of one-bit data corresponding to a bit width of the memory cell array can be read out from or written in the memory cells of the memory cell array in one access operation.

The object is also achieved by the provision of a semiconductor storing device including the bit line control unit and a word line changing unit.

The word line changing unit sets the word line selected by the row address decoder to an active state in the memory cell block or the memory cell blocks in which the bit line corresponding to the bit select line selected by the column address decoder is set to the active state by the bit line control unit, changes the word line selected by the row address decoder, in the remaining memory cell block or the remaining memory cell blocks or no remaining memory cell block in which the bit line of the specific address group is set to the active state by the bit line control unit, to another word line corresponding to a specific address group, which is higher than an address group of the word line selected by the row address decoder and is nearest to the address group of the word line among address groups of the word lines, in a case where the word line selected by the row address decoder does not correspond to the highest address group among the address groups of the word lines, changes the word line selected by the row address decoder, in the remaining memory cell block or the remaining memory cell blocks or no remaining memory cell block in which the bit line of the specific address group is set to the active state by the bit line control unit, to the word line corresponding to the lowest address group among the address groups of the word lines, in a case where the word line selected by the row address decoder corresponds to the highest address group among the address. groups of the word lines, and sets each of the changed word lines to an active state.

In the above configuration, in cases where the word line selected by the row address decoder is connected with the memory cells of an address group which is highest among address groups of the word lines, the word line corresponding to the highest address group is set to an active state in one memory cell block or memory cell blocks placed on the side of the second column position by the word line changing unit, and the word line corresponding to the lowest address group among those of the word lines is set to an active state by the word line changing unit in the remaining memory cell block or the remaining memory cell blocks or no remaining memory cell block placed on the side of the first column position. Also, in the bit line control unit, the bit line corresponding to the bit select line selected by the column address decoder is set to an active state in the memory cell block(s) in which the word line corresponding to the highest address group is set to the active state, and the bit line of the specific address group, which is higher than that of the bit line corresponding to the bit select line selected by the column address decoder and is nearest to the address group of the bit line among address groups of the bit lines of one memory cell block, is set to an active state in the remaining memory cell block(s) in which the word line corresponding to the lowest address group is set to the active state.

Accordingly, even though a top memory cell placed at the top among a plurality of memory cells of pieces of one-bit data planed to be read out or written is placed in the middle of a row of memory cells, the pieces of one-bit data corresponding to a bit width of the memory cell array can be read out from or written in the memory cells of the memory cell array in one access operation.

The object is also achieved by the provision of a semiconductor storing device including the word line changing unit and a bit line control unit The bit line control unit controls one bit selector or each of bit selectors corresponding to the memory cell block or each of the memory cell blocks, in which the word line selected by the row address decoder is set to the active state by the word line changing unit, to select the bit line corresponding to the bit select line selected by the column address decoder, controls one bit selector or each of bit selectors or no bit selector corresponding to the remaining memory cell block or each of the remaining memory cell blocks or no remaining memory cell block, in which the word line corresponding to the specific address group is set to the active state by the word line changing unit, to select one bit line of a specific address group, which is higher than an address group of the bit line corresponding to the bit select line selected by the column address decoder and is nearest to the address group of the bit line among address groups of the bit lines of the corresponding memory cell block, from the bit lines of the corresponding memory cell block, in a case where the bit select line selected by the column address decoder does not correspond to the bit line of the highest address group, and to select the bit line of the lowest address group from among the bit lines of the remaining memory cell block in a case where the bit select line selected by the column address decoder corresponds to the bit line of the highest address group, and sets each of the selected bit lines of the memory cell blocks to an active state.

In the above configuration, in cases where the bit select line selected by the column address decoder corresponds to the bit line of the highest address group among those of the bit lines in one memory cell block, the bit line of the highest address group is set to an active state in the bit line control unit in one memory cell block or each of memory cell blocks placed on the side of the second column position, and the bit line of the lowest address group among those of the bit lines in one memory cell block is set to an active state in the bit line control unit in the remaining memory cell block or each of the remaining memory cell blocks or no remaining memory cell block placed on the side of the first column position. Also, in the word line changing unit, the word line selected by the row address decoder is set to an active state in the memory cell block(s) in which the bit line of the highest address group is set to the active state, and the word line of the specific address group, which is higher than that of the bit line corresponding to the bit select line selected by the column address decoder and is nearest to that of the bit line among address groups of the bit lines of one memory cell block, is set to the active state in the remaining memory cell block(s) in which the bit line of the lowest address group is set to the active state.

Accordingly, even though a top memory cell placed at the top among a plurality of memory cells of pieces of one-bit data planed to be read out or written is placed in the middle of a row of memory cells, the pieces of one-bit data corresponding to a bit width of the memory cell array can be read out from or written in the memory cells of the memory cell array in one access operation.

BRIEF DESCRIPTION OF THE DRAWINGS

FIG. 1A is a block diagram showing the configuration of a semiconductor storing device according to a first embodiment of the present invention;

FIG. 2 is a block diagram showing the configuration of a semiconductor storing device according to a second embodiment of the present invention;

FIG. 3 is a block diagram showing the configuration of a semiconductor storing device according to a third embodiment of the present invention;

DETAILED DESCRIPTION OF THE PREFERRED EMBODIMENTS

Embodiments of the present invention will now be described with reference to the accompanying drawings.
Embodiment 1

Figure 1B:
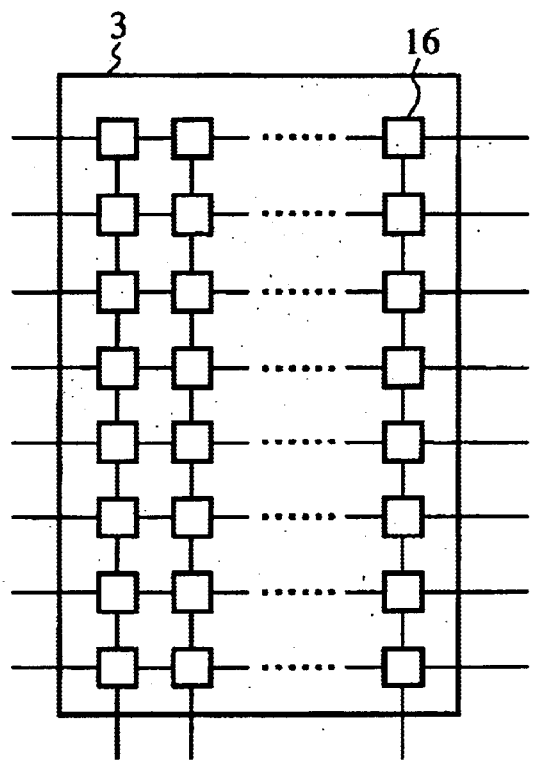
FIG. 1B is a schematic view of a plurality of memory cells disposed in a memory cell block shown in FIG. 1A.
Figure 1C:
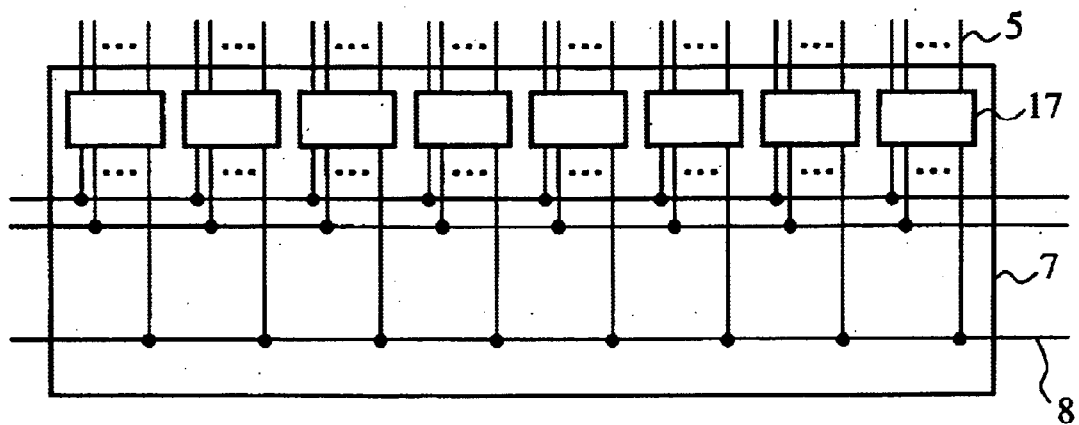
FIG. 1C is a schematic view of a plurality of bit selectors disposed in a bit selector block shown in FIG. 1A.

FIG. 1A is a block diagram showing the configuration of a semiconductor storing device according to a first embodiment of the present invention, FIG. 1B is a schematic view of a plurality of memory cells disposed in each memory cell block shown in FIG. 1A, and FIG. 1C is a schematic view of a plurality of bit selectors disposed in each bit selector block shown in FIG. 1A.

In FIG. 1A, FIG. 1B and FIG. 1C, 1 indicates a semiconductor storing device. 2 indicates a memory cell array having a plurality of memory cells 16. The memory cells 16 are disposed in a matrix of a plurality of columns respectively extending in a column direction and a plurality of rows respectively extending in a row direction from a first column position to a second column position. 32×N addresses (N denotes an integral number equal to or higher than two) starting from "00" are assigned to the memory cells 16 of the memory cell array 2 in one-to-one correspondence according to the first addressing arrangement shown in FIG. 10.

Therefore, a group of addresses assigned to one group of memory cells 16 of the bit lines 5 corresponding to each bit select line 8 in each row are increased with the change of the group of memory cells 16 in the row direction, the address is consecutively increased in the row direction in each group of memory cells 16 for each row, and the addresses of consecutive numbers are assigned to the memory cells 16 connected with the bit lines 5 corresponding to each bit select line 8. In this case, a group of addresses (or an address group) of memory cells 16 connected with one word line 4 is higher or lower than that corresponding to another word line 4. In particular, in this embodiment, a group of addresses of memory cells 16 connected with a remarked word line 4 is increased as the remarked word line 4 is changed to another word line 4 placed at a lower position. Also, a group of addresses (or an address group) of memory cells 16 connected with one bit line 5 of each bit selector 17 is higher or lower than that corresponding to another bit line 5 of the bit selector 17. In particular, in this embodiment, a group of addresses of memory cells 16 connected with a remarked bit line 5 of each bit selector 17 is increased as the remarked bit line 5 is changed to another bit line 5 placed on the right side of the remarked bit line 5 in the bit selector 17. In case of N=2, the arrangement of the addresses assigned to the memory cells 16 is the same as that assigned to the memory cells 103 shown in FIG. 10.

The memory cell array 2 is divided into a first memory cell block 3 placed on the right side, a second memory cell block 3, a third memory cell block 3 and a fourth memory cell block 3 arranged in an inverse row direction in that order in parallel to each other. Each memory cell block 3 has the memory cells 16 disposed in a matrix of 8 rows and 8×N columns and has an 8-bit width in the row direction. Therefore, the memory cell array 2 has a 32-bit width in the row direction.

4 indicates each of eight word lines corresponding to the rows respectively, and each word line 4 is connected with 32×N memory cells 16 placed in the corresponding row. 5 indicates each of a plurality of bit lines corresponding to the columns respectively, and the number of bit lines 5 is equal to 32×N. Each bit line 5 is connected with eight memory cells 16 placed in the corresponding column.

6 indicates a bit selector array. The bit selector array 6 is divided into a first bit selector block 7 placed on the right side, a second bit selector block 7, a third bit selector block 7 and a fourth bit selector block 7 arranged in the inverse row direction in that order in parallel to each other. The bit selector blocks 7 relate to the memory cell blocks 3 in one-to-one correspondence. 8 indicates each of a plurality of bit select lines of which the number is equal to N. The bit select lines 8 are shown in FIG. 1A by one line for convenience. 11 indicates a column address decoder connected with one end of each bit select line 8. A column address signal included in a first address signal is sent from the outside and is received in the column address decoder 11, and one of the bit select lines 8 is selected in the column address decoder 11 according to the column address signal. Each bit selector block 7 has eight bit selectors 17, and each bit selector 17 is connected with N bit lines 5 and N bit select lines 8 relating to the N bit lines 5 in one-to-one correspondence. Therefore, each bit selector block 7 is connected with 8×N bit lines 5. Each group of N bit lines connected with the bit selector block 7 is shown by one line in FIG. 1A for convenience. In each bit selector 17, one bit line 5 corresponding to the bit select line 8 selected in the column address decoder 11 is selected, and one-bit data of "0" or "1" is read out from or written in one memory cell 16 connected with the selected bit line 5 and one selected word line 4 through each bit selector 17 of the bit selector block 7. Data-M (M denotes an integral number ranging from 0 to 31) such as data-0, data-1, data-2, . . . , and data-31 shown in FIG. 1A represents the one-bit data read out from or written in the memory cell 16. 9 indicates each of a plurality of signal lines of which the number is equal to 32. Each signal line 9 is connected with one bit selector 17, so that each bit selector block 7 is connected with eight signal lines 9. The group of eight signal lines 9 connected with each bit selector block 7 is shown by one line in FIG. 1A for convenience.

10 indicates a first row address decoder connected with one end of each word line 4. A row address signal (or a first row address signal) included in the first address signal is received in the first row address decoder 10, and one of the word lines 4 is selected in the first row address decoder 10 according to the row address signal. 12 indicates a second row address decoder connected with the other end of each word line 4. A row address signal (or a second row address signal) included in a second address signal is sent from the outside and is received in the second row address decoder 12, and a specific word line 4 corresponding to a specific address group, which is higher than an address group of the word line 4 selected in the first row address decoder 10 and is nearest to the address group of the word line 4 selected in the first row address decoder 10 among address groups of all the word lines 4, is selected in the second row address decoder 12 according to the row address signal of the second address signal. That is, in cases where a first group of addresses are assigned to a group of memory cells 16 of the word line 4 selected in the first row address decoder 10, a specific word line 4 connected with a group of memory cells 16, to which a second group of addresses higher than the first group of addresses and nearest to the first group of addresses among groups of addresses of all the word lines 4 are assigned, is selected in the second row address decoder 12.

The selection of the specific word line 4 performed in the second row address decoder 12 is described with reference to FIG. 10 in detail. In cases where the first word line 4 from the top is selected in the first row address decoder 10, a first group of addresses "00", "20", "01", "21", "02", "22", "03" and "23" are assigned to the memory cells 16 connected with the selected first word line 4, and a second word line 4 from the top is connected with memory cells 16 of a group of addresses "04", "24", "05", "25", "06", "26", "07" and "27" which are higher than the first group of addresses and nearest to the first group of addresses among groups of addresses of all word lines 4. Therefore, the second word line 4 from the top is selected in the second row address decoder 12 as the specific word line 4. In this embodiment, because the addresses are assigned to the memory cells 16 so as to heighten the address value in the column direction, the word line 4 selected in the second row address decoder 12 is placed below the word line 4 selected in the first row address decoder 10 by one line.

13a indicates a first word line control circuit (or a word line control unit) connected with the word lines 4 extending from both the first memory cell block 3 nearest to the first row address decoder 10 and the second memory cell block 3 adjacent to the first memory cell block 3. 13b indicates a second word line control circuit (or the word line control unit) connected with the word lines 4 extending from both the second memory cell block 3 and the third memory cell block 3 adjacent to the second memory cell block 3. 13c indicates a third word line control circuit (or the word line control unit) connected with the word lines 4 extending from both the third memory cell block 3 and the fourth memory cell block 3 adjacent to the third memory cell block 3. 13d indicates a fourth word line control circuit (or the word line control unit) connected with the word lines 4 extending from both the fourth memory cell block 3 and the second row address decoder 12. Each of the word line control circuits 13a to 13d is composed of a plurality of n-channel metal oxide semiconductor (NMOS) transistors 14 having source electrodes and drain electrodes connected with the word lines 4 in one-to-one correspondence and a control line 15 connected with gate electrodes of the NMOS transistors 14.

As a first example, an L signal of a low level is input to the control line 15 of the first word line control circuit 13a to turn off the NMOS transistors 14 of the first word line control circuit 13a, and an H signal of a high level is input to the control lines 15 of the other word line control circuits 13b, 13c and 13d to turn on the NMOS transistors 14 of the other word line control circuits 13b, 13c and 13d. In this case, the word line 4 selected in the first row address decoder 10 is set to an active state (or a high level) in the first memory cell block 3 placed on the side of the first row address decoder 10 from the first word line control circuits 13a, and the specific word line 4 selected in the second row address decoder 12 is set to an active state in the second, third and fourth memory cell blocks 3 placed on the side of the second row address decoder 12 from the first word line control circuits 13a.

Also, as a second example, the L signal is input to the control line 15 of the second word line control circuit 13b to turn off the NMOS transistors 14 of the second word line control circuit 13b, and the H signal is input to the control lines 15 of the other word line control circuits 13a, 13c and 13d to turn on the NMOS transistors 14 of the other word line control circuits 13a, 13c and 13d. In this case, the word line 4 selected in the first row address decoder 10 is set to an active state in the first and second memory cell blocks 3 placed on the side of the first row address decoder 10 from the second word line control circuits 13b, and the specific word line 4 selected in the second row address decoder 12 is set to an active state in the third and fourth memory cell blocks 3 placed on the side of the second row address decoder 12 from the second word line control circuits 13b.

Also, as a third example, the L signal is input to the control line 15 of the third word line control circuit 13c to turn off the NMOS transistors 14 of the third word line control circuit 13c, and the H signal is input to the control lines 15 of the other word line control circuits 13a, 13b and 13d to turn on the NMOS transistors 14 of the other word line control circuits 13a, 13b and 13d. In this case, the word line 4 selected in the first row address decoder 10 is set to an active state in the first, second and third memory cell blocks 3 placed on the side of the first row address decoder 10 from the third word line control circuits 13b, and the specific word line 4 selected in the second row address decoder 12 is set to an active state in the fourth memory cell block 3 placed on the side of the second row address decoder 12 from the third word line control circuits 13c.

Also, as a fourth example, the L signal is input to the control line 15 of the fourth word line control circuit 13d to turn off the NMOS transistors 14 of the fourth word line control circuit 13d, and the H signal is input to the control lines 15 of the other word line control circuits 13a, 13b and 13c to turn on the NMOS transistors 14 of the other word line control circuits 13a, 13b and 13c. In this case, the word line 4 selected in the first row address decoder 10 is set to an active state in the first, second, third and fourth memory cell blocks 3 placed on the side of the first row address decoder 10 from the fourth word line control circuits 13d.

Next, an operation of the semiconductor storing device 1 will be described.

An operation of reading out or writing 32-bit data corresponding to the 32-bit width of the memory cell array 2 in the row direction from/in thirty-two memory cells 16, to which addresses ranging from the first address "00" to the fourth address "03" are assigned, will be initially described.

Because the addresses are assigned to the memory cells 16 of the memory cell array 2 according to the first addressing arrangement, the thirty-two memory cells 16 are connected with the first word line 4 from the top and the first bit lines 5 from the left in the bit selectors 17. The memory cells 16 of the address "00" are placed in the fourth memory cell block 3, the memory cells 16 of the address "01" are placed in the third memory cell block 3, the memory cells 16 of the address "02" are placed in the second memory cell block 3, and the memory cells 16 of the address "03" are placed in the first memory cell block 3.

In an access operation, the L signal is input to the control line 15 of the fourth word line control circuit 13d, and the H signal is input to the control lines 15 of the other word line control circuits 13a, 13b and 13c. In this case, the NMOS transistors 14 of the fourth word line control circuit 13d are turned off, and the NMOS transistors 14 of the other word line control circuits 13a, 13b and 13c are turned on. Therefore, a word line 4 selected in the first row address decoder 10 can be set to an active state in the first, second, third and fourth memory cell blocks 3 placed on the side of the first row address decoder 10 from the fourth word line control circuits 13d.

Thereafter, in the access operation, the first word line 4 from the top is selected in the first row address decoder 10, and a prescribed bit select line 8 is selected in the column address decoder 11 to select the first bit line 5 from the left among the N bit lines 5 in each bit selector 17. In this case, the first word line 4 from the top is set to an active state in the first, second, third and fourth memory cell blocks 3 placed on the side of the first row address decoder 10 from the fourth word line control circuits 13d. Therefore, thirty-two pieces of one-bit data denoting 32-bit data are read out from or written in thirty-two memory cells 16, to which the addresses "00" to "03" are assigned, through the bit selectors 17 of the bit selector blocks 7. In this case, there is no remaining memory cell block, an operation based on the second row address decoder 12 is not performed.

Accordingly, 32-bit data can be read out from or written in the memory cell array 2 every access operation in case of the first addressing arrangement.

Next, an operation of reading out or writing 32-bit data corresponding to the 32-bit width of the memory cell array 2 in the row direction from/in thirty-two memory cells 16, to which the addresses starting from the second address "01" and ending to the fifth address "04" are assigned, will be described. The top memory cell 16 among the memory cells 16 of the second address "01" is placed in the middle of the memory cells 16 of one row.

Twenty-four memory cells 16 of the addresses "01" to "03" are connected with the first word line 4 from the top and the first bit lines 5 from the left in the bit selectors 17, eight memory cells 16 of the fifth address "04" are connected with the second word line 4 from the top and the first bit lines 5 from the left in the bit selectors 17, and the memory cells 16 of the fifth address "04" are placed in the fourth memory cell block 3.

In an access operation, the L signal is input to the control line 15 of the third word line control circuit 13c, and the H signal is input to the control lines 15 of the other word line control circuits 13a, 13b and 13d. In this case, the NMOS transistors 14 of the third word line control circuit 13c are turned off, and the NMOS transistors 14 of the other word line control circuits 13a, 13b and 13d are turned on. Therefore, a word line 4 selected in the first row address decoder 10 can be set to an active state in the first, second and third memory cell blocks 3 placed on the side of the first row address decoder 10 from the third word line control circuits 13c, and a word line 4 selected in the second row address decoder 12 can be set to an active state in the fourth memory cell block 3 placed on the side of the second row address decoder 12 from the third word line control circuits 13c.

Thereafter, in the access operation, the first word line 4 from the top is selected in the first row address decoder 10, a specific word line 4 corresponding to a specific address group, which is higher than an address group of the first word line 4 selected in the first row address decoder 10 and is nearest to the address group of the first word line 4 among address groups of all the word lines 4, is selected in the second row address decoder 12. That is, the second word line 4 from the top is selected in the second row address decoder 12. Also, a prescribed bit select line 8 is selected in the column address decoder 11 to select the first bit line 5 from the left among the N bit lines 5 in each bit selector 17. In this case, the first word line 4 from the top is set to an active state in the first, second and third memory cell blocks 3 placed on the side of the first row address decoder 10 from the third word line control circuits 13c, and twenty-four pieces of one-bit data are read out from or written in twenty-four memory cells 16 which are connected with the first word line 4 and the first bit lines 5 set to the active state and to which the addresses "01" to "03" are assigned. Also, the second word line 4 from the top selected in the second row address decoder 12 is set to an active state in the fourth memory cell block 3 (or the remaining memory cell block 3) placed on the side of the second row address decoder 12 from the third word line control circuits 13c, and eight pieces of one-bit data are read out from or written in each of eight memory cells 16 which are connected with the second word line 4 and the first bit lines 5 set to the active state and to which the address "04" is assigned. Therefore, thirty-two pieces of one-bit data are read out from or written in the thirty-two memory cells 16, to which the addresses "01" to "04" are assigned, through the bit selectors 17 of the bit selector blocks 7 as 32-bit data.

Accordingly, 32-bit data can be read out from or written in the memory cell array 2 every access operation in case of the first addressing arrangement.

Next, an operation of reading out or writing 32-bit data corresponding to the 32-bit width of the memory cell array 2 in the row direction from/in thirty-two memory cells 16, to which the addresses starting from the third address "02" and ending to the sixth address "05" are assigned, will be described. This read or write operation is performed in one access operation in the semiconductor storing device in the almost same manner as that for the addresses "01" to "04".

In brief, the top memory cell 16 among the memory cells 16 of the third address "02" is placed in the middle of the memory cells 16 of the first row. Sixteen memory cells 16 of the addresses "02" to "03" are connected with the first word line 4 from the top and the first bit lines 5 from the left in the bit selectors 17, sixteen memory cells 16 of the addresses "04" and "05" are connected with the second word line 4 from the top and the first bit lines 5 from the left in the bit selectors 17, and the memory cells 16 of the sixth address "05" are placed in the third memory cell block 3. In this case, the L signal is input to the control line 15 of the second word line control circuit 13b, and the NMOS transistors 14 of the second word line control circuit 13b are tuned off. The H signal is input to the control lines 15 of the other word line control circuits 13a, 13c and 13d, and the NMOS transistors 14 of the other word line control circuits 13a, 13c and 13d are tuned on. The first word line 4 is selected in the first row address decoder 10 to be set to an active state in the first and second memory cell blocks 3, and the second word line 4 is selected in the second row address decoder 12 to be set to an active state in the third and fourth memory cell blocks 3 (or the remaining memory cell blocks 3). Therefore, thirty-two pieces of one-bit data are read out from or written in thirty-two memory cells 16, to which the addresses "02" to "05" are assigned, through the bit selectors 17 of the bit selector blocks 7 as 32-bit data.

Accordingly, 32-bit data can be read out from or written in the memory cell array 2 every access operation in case of the first addressing arrangement.

Next, an operation of reading out or writing 32-bit data corresponding to the 32-bit width of the memory cell array 2 in the row direction from/in thirty-two memory cells 16, to which the addresses starting from the fourth address "03" and ending to the seventh address "06" are assigned, will be described. This read or write operation is performed in one access operation in the semiconductor storing device in the almost same manner as that for the addresses "01" to "04".

In brief, the top memory cell 16 among the memory cells 16 of the fourth address "03" is placed in the middle of the memory cells 16 of the first row. Eight memory cells 16 of the address "03" are connected with the first word line 4 from the top and the first bit lines 5 from the left in the bit selectors 17, twenty-four memory cells 16 of the addresses "04", "05" and "06" are connected with the second word line 4 from the top and the first bit lines 5 from the left in the bit selectors 17, and the memory cells 16 of the seventh address "06" are placed in the second memory cell block 3. In this case, the L signal is input to the control line 15 of the first word line control circuit 13a, and the NMOS transistors 14 of the first word line control circuit 13a are tuned off. The H signal is input to the control lines 15 of the other word line control circuits 13b, 13c and 13d, and the NMOS transistors 14 of the other word line control circuits 13b, 13c and 13d are tuned on. The first word line 4 is selected in the first row address decoder 10 to be set to an active state in the first memory cell block 3, and the second word line 4 is selected in the second row address decoder 12 to be set to an active state in the second, third and fourth memory cell blocks 3 (or the remaining memory cell blocks 3). Therefore, thirty-two pieces of one-bit data are read out from or written in thirty-two memory cells 16, to which the addresses "03" to "06" are assigned, through the bit selectors 7 of the bit selector blocks 7 as 32-bit data.

Accordingly, 32-bit data can be read out from or written in the memory cell array 2 every access operation in case of the first addressing arrangement.

As is described above, in the first embodiment, the memory cell array 2 is divided into the memory cell blocks 3 respectively having the 8-bit width in the row direction, the first row address decoder 10 is connected with one end of each word line 4, the second row address decoder 12 is connected with the other end of each word line 4, one word line 4 is selected in the first row address decoder 10, a specific word line 4 corresponding to a specific address group, which is higher than an address group of the word line 4 selected in the first row address decoder 10 and is nearest to the address group of the word line 4 among address groups of all the word lines 4, is selected in the second row address decoder 12, and each of the word line control circuits 13a to 13d is connected with the word lines 4 extending from both the memory cell blocks 3 adjacent to each other or both the memory cell block 3 and the second row address decoder 12.

Therefore, when one word line control circuit is set to electrically disconnect the memory cell blocks 3 connected with the word line control circuit from each other while setting the other word line control circuits to electrically connect the memory cell blocks 3 and the second row address decoder 12 adjacent to the other word line control circuits, pieces of data corresponding to the bit width of the memory cell array 2 can be read out from or written in a plurality of memory cells 16 of the memory cell array 2 in one access operation even though the top memory cell 16 placed at the top among the memory cells 16 is placed in the middle of a row of memory cells.

Embodiment 2

FIG. 2 is a block diagram showing the configuration of a semiconductor storing device according to a second embodiment of the present invention. The constituent elements which are the same as those shown in FIG. 1, are indicated by the same reference numerals as those of the constituent elements shown in FIG. 1, and additional description of those constituent elements is omitted.

Figure 11:
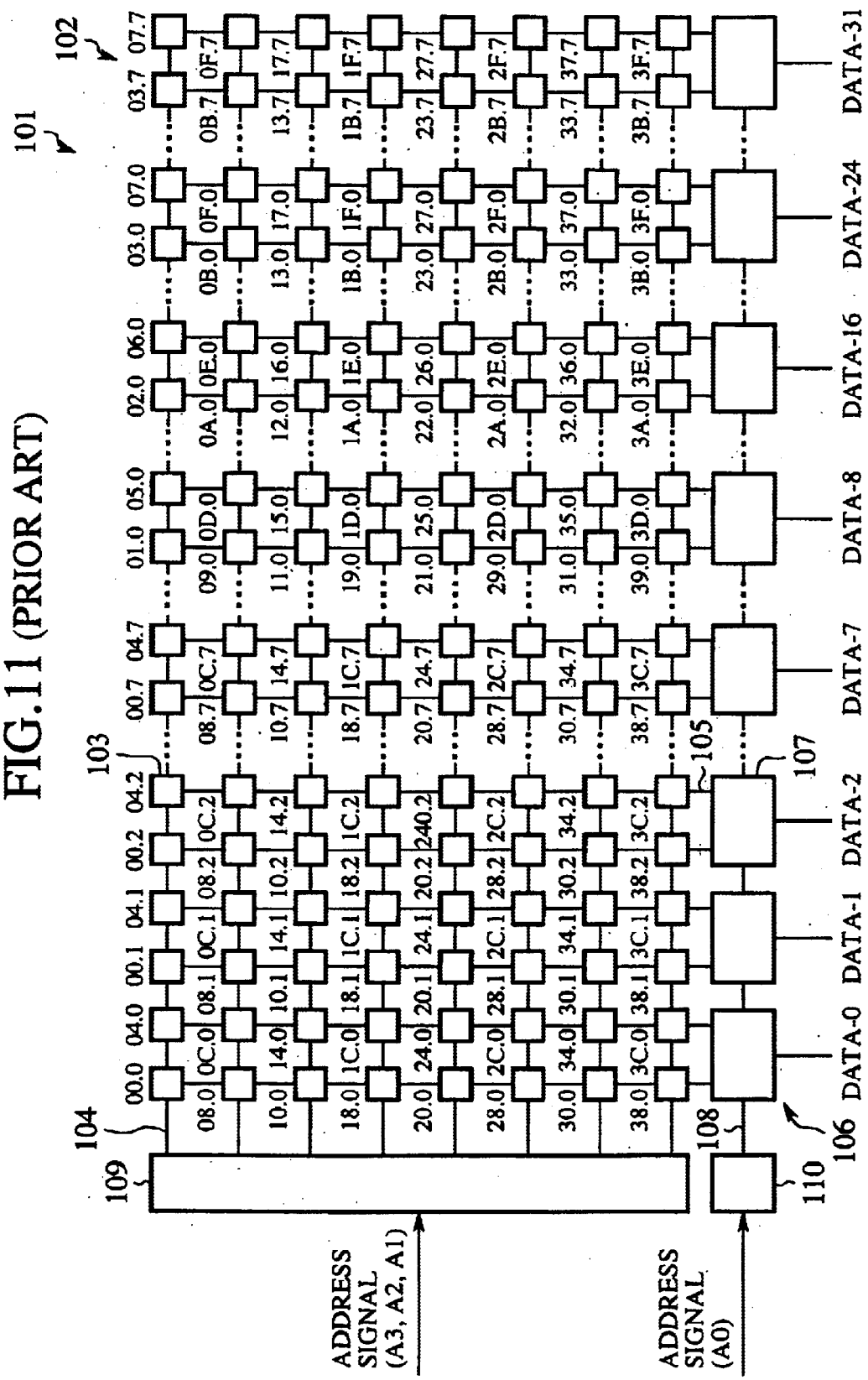
FIG. 11 is a view showing a second addressing arrangement in which addresses are assigned to memory cells of a memory cell array shown in FIG. 9.

In FIG. 2, 21 indicates a semiconductor storing device including the memory cell array 2 in which the addresses are assigned to the memory cells 16 (refer to FIG. 1B) according to the second addressing arrangement shown in FIG. 11.

Therefore, a group of addresses assigned to one group of memory cells 16 of the bit lines 5 corresponding to each bit select line 8 in each row are increased with the change of the group of memory cells 16 in the row direction, the address is consecutively increased in the row direction in each group of memory cells 16 for each row, and the addresses of consecutive numbers are assigned to the memory cells 16 of each row. In this case, a group of addresses (or an address group) of memory cells 16 connected with one word line 4 is higher or lower than that corresponding to another word line 4. In particular, in this embodiment, a group of addresses of memory cells 16 connected with a remarked word line 4 is increased as the remarked word line 4 is changed to another word line 4 placed at a lower position. Also, a group of addresses of memory cells 16 connected with one bit line 5 of each bit selector 17 is higher or lower than that corresponding to another bit line 5 of the bit selector 17. In particular, in this embodiment, a group of addresses of memory cells 16 connected with a remarked bit line 5 of each bit selector 17 is increased as the remarked bit line 5 is changed to another bit line 5 placed on the right side of the remarked bit line 5 in the bit selector 17. In case of N=2, the arrangement of the addresses assigned to the memory cells 16 is the same as that assigned to the memory cells 103 shown in FIG. 11.

22 indicates a row address decoder connected with one end of each word line 4. A row address signal included in a first address signal is received in the row address decoder 22, and one of the word lines 4 is selected in the row address decoder 22 according to the row address signal. 23 indicates a first column address decoder connected with one end of each bit select line 8. A column address signal (or a first column address signal) included in the first address signal is sent from the outside and is received in the first column address decoder 23, and one bit select line 8 corresponding to a first group of bit lines 5 is selected in the first column address decoder 23 according to the column address signal.

24 indicates a second column address decoder connected with the other end of each bit select line 8. A column address signal (or a second column address signal) included in a second address signal is sent from the outside and is received in the second column address decoder 24, and a specific bit select line 8 is selected in the second column address decoder 24 according to the column address signal of the second address signal on condition that a specific address group of a specific bit line 5 corresponding to the specific bit select line 8 in each bit selector 17 is higher than an address group of the bit line 5 corresponding to the bit select line 8 selected in the first column address decoder 23 in the bit selector 17 and is nearest to that of the bit line 5 corresponding to the bit select line 8 selected in the first column address decoder 23 among address groups of all the bit lines 5 of the bit selector 17. That is, a bit line 5 corresponding to the bit select line 8 selected in the first column address decoder 23 in each bit selector 17 is connected with a first group of memory cells 16 of a first address group, the specific bit line 5 corresponding to the specific bit select line 8 selected in the second column address decoder 24 in the bit selector 17 is connected with a specific group of memory cells 16 of a specific address group, the specific address group of the specific group of memory cells 16 connected with the specific bit line 5 is higher than the first address group of the first group of memory cells 16 of the bit line 5 corresponding to the bit select line 8 selected in the first column address decoder 23 in the bit selector 17 and is nearest to the first address group among address groups of groups of memory cells 16 connected with all the bit lines 5 of the bit selector 17.

The selection of the specific bit select line 8 performed in the second column address decoder 24 is described with reference to FIG. 11 corresponding to N=2 in detail. A first bit line 5 from the left is selected in one bit selector 17 according to the bit select line 8 selected in the first column address decoder 23. In this case, a first group of addresses "00", "08", "10", "18", "20", "28", "30" and "38" are, for example, assigned to a first group of memory cells 16 connected with the first bit line 5 from the left, a specific bit select line 8 placed on the second position from the top corresponds to a second bit line 5 from the left connected with a specific group of memory cells 16 to which a specific group of addresses "04", "0C", "14", "1C", "24", "2C", "34" and "3C" are assigned. The specific group of addresses are higher than the first group of addresses and are nearest to the first group of addresses among the groups of addresses of groups of memory cells 16 connected with the bit lines 5 of the bit selector 17.

25a indicates a first bit line control circuit (or a bit line control unit) connected with the group of bit select lines 8 extending from the first bit selector block 7 nearest to the first column address decoder 23 and the group of bit select lines 8 of the second bit selector block 7 adjacent to the first bit selector block 7. 25b indicates a second bit line control circuit (or the bit line control unit) connected with the group of bit select lines 8 of the second bit selector block 7 and the group of bit select lines 8 of the third bit selector block 7 adjacent to the second bit selector block 7. 25c indicates a third bit line control circuit (or the bit line control unit) connected with the group of bit select lines 8 of the third bit selector block 7 and the group of bit select lines 8 of the fourth bit selector block 7 adjacent to the third bit selector block 7. 25d indicates a third bit line control circuit (or the bit line control unit) connected with the group of bit select lines 8 of the fourth bit selector block 7 and the group of bit select lines 8 of the second column address decoder 24. Each of the bit line control circuits 25a to 25d is composed of a plurality of NMOS transistors 26, in which source electrodes and drain electrodes are connected with the N bit select lines 8 in one-to-one correspondence, and a control signal line 27 connected with a gate electrode of each NMOS transistor 26. In FIG. 2, because only one bit select line 8 is shown for convenience, only one NMOS transistor 26 is shown for each bit line control circuit.

As a first example, an L signal of a low level is input to the control signal line 27 of the first bit line control circuit 25a to turn off the NMOS transistor 26 of the first bit line control circuit 25a, and an H signal of a high level is input to the control signal lines 27 of the other bit line control circuits 25b, 25c and 25d to turn on the NMOS transistors 26 of the other bit line control circuits 25b, 25c and 25d. In this case, in the bit selectors 17 (refer to FIG. 1C) of the first bit selector block 7 placed on the side of the first column address decoder 23 from the first bit line control circuit 25a, a plurality of bit lines 5 corresponding to the bit select line 8 selected in the first column address decoder 23 are selected, and each selected bit line 5 is set to an active state (or a high level). Also, in the bit selectors 17 of the second, third and fourth bit selector blocks 7 placed on the side of the second column address decoder 24 from the first bit line control circuit 25a, a plurality of bit lines 5 corresponding to the specific bit select line 8 selected in the second column address decoder 24 are selected, and each selected bit line 5 is set to an active state.

As a second example, the L signal is input to the control signal line 27 of the second bit line control circuit 25b to turn off the NMOS transistor 26 of the second bit line control circuit 25b, and the H signal is input to the control signal lines 27 of the other bit line control circuits 25a, 25c and 25d to turn on the NMOS transistors 26 of the other bit line control circuits 25a, 25c and 25d. In this case, in the bit selectors 17 of the first and second bit selector blocks 7 placed on the side of the first column address decoder 23 from the second bit line control circuit 25b, a plurality of bit lines 5 corresponding to the bit select line 8 selected in the first column address decoder 23 are selected, and each selected bit line 5 is set to an active state. Also, in the bit selectors 17 of the third and fourth bit selector blocks 7 placed on the side of the second column address decoder 24 from the second bit line control circuit 25b, a plurality of bit lines 5 corresponding to the specific bit select line 8 selected in the second column address decoder 24 are selected, and each selected bit line 5 is set to an active state.

As a third example, the L signal is input to the control signal line 27 of the third bit line control circuit 25c to turn off the NMOS transistor 26 of the third bit line control circuit 25c, and the H signal is input to the control signal lines 27 of the other bit line control circuits 25a, 25b and 25d to turn on the NMOS transistors 26 of the other bit line control circuits 25a, 25b and 25d. In this case, in the bit selectors 17 of the first, second and third bit selector blocks 7, which are placed on the side of the first column address decoder 23 from the third bit line control circuit 25c, a plurality of bit lines 5 corresponding to the bit select line 8 selected in the first column address decoder 23 are selected, and each selected bit line 5 is set to an active state. Also, in the bit selectors 17 of the fourth bit selector block 7 placed on the side of the second column address decoder 24 from the third bit line control circuit 25c, a plurality of bit lines 5 corresponding to the specific bit select line 8 selected in the second column address decoder 24 are selected, and each selected bit line 5 is set to an active state.

As a fourth example, the L signal is input to the control signal line 27 of the fourth bit line control circuit 25d to turn off the NMOS transistor 26 of the fourth bit line control circuit 25d, and the H signal is input to the control signal lines 27 of the other bit line control circuits 25a, 25b and 25c to turn on the NMOS transistors 26 of the other bit line control circuits 25a, 25b and 25c. In this case, in the bit selectors 17 of the first, second, third and fourth bit selector blocks 7, which are placed on the side of the first column address decoder 23 from the third bit line control circuit 25c, a plurality of bit lines 5 corresponding to the bit select line 8 selected in the first column address decoder 23 are selected, and each selected bit line 5 is set to an active state. Also, no bit line 5 is set to an active state according to the specific bit select line 8 selected in the second column address decoder 24.

Next, an operation of the semiconductor storing device 21 will be described.

An operation of reading out or writing 32-bit data corresponding to the 32-bit width of the memory cell array 2 in the row direction from/in thirty-two memory cells 16, to which addresses ranging from the first address "00" to the fourth address "03" are assigned, will be initially described.

Because the addresses are assigned to the memory cells 16 of the memory cell array 2 according to the second addressing arrangement, the thirty-two memory cells 16 are connected with the first word line 4 from the top and the first bit lines 5 from the left in the bit selectors 17, the memory cells 16 of the address "00" is placed in the fourth memory cell block 3 furthest from the row address decoder 22, the memory cells 16 of the address "01" is placed in the third memory cell block 3 adjacent to the fourth memory cell block 3, the memory cells 16 of the address "02" is placed in the second memory cell block 3 adjacent to the third memory cell block 3, and the memory cells 16 of the address "03" is placed in the first memory cell block 3 adjacent to the second memory cell block 3.

In an access operation, the L signal is input to the control signal line 27 of the fourth bit line control circuit 25d, and the H signal is input to the control signal lines 27 of the other bit line control circuits 25a, 25b and 25c. Therefore, a plurality of bit lines 5 corresponding to a bit select line 8 selected in the first column address decoder 23 can be selected in the bit selectors 17 of the first, second, third and fourth bit selector blocks 7 and can be respectively set to an active state.

Thereafter, in the access operation, the first bit select line 8 from the top is selected in the first column address decoder 23 to select the first bit lines 5 from the left in the bit selectors 17 of the first, second, third and fourth bit selector blocks 7, and the first word line 4 from the top is selected in the row address decoder 22. Therefore, the first bit lines 5 and the first word line 4 connected with thirty-two memory cells of the addresses "00" to "03" are respectively set to an active state, and thirty-two pieces of one-bit data are read out from or written in the thirty-two memory cells 16 of the addresses "00" to "03" as 32-bit data. In this operation, because there is no remaining bit selector block, an operation in the memory cell array 2 based on the second column address decoder 24 is not performed.

Accordingly, 32-bit data can be read out from or written in the memory cell array 2 every access operation in case of the second addressing arrangement.

Next, an operation of reading out or writing 32-bit data corresponding to the 32-bit width of the memory cell array 2 in the row direction from/in thirty-two memory cells 16, to which the addresses starting from the second address "01" and ending to the fifth address "04" are assigned, will be described. The top memory cell 16 among the memory cells 16 of the second address "01" is placed in the middle of the memory cells 16 of the first row.

Twenty-four memory cells 16 of the addresses "01" to "03" are connected with the first bit lines 5 from the left in the bit selectors 17 and the first word line 4 from the top. Eight memory cells 16 of the fifth address "04" are placed in the fourth memory cell block 3 and are connected with the second bit lines 5 from the left in the bit selectors 17 and the first word line 4 from the top.

In an access operation, the L signal is input to the control signal line 27 of the third bit line control circuit 25c, and the H signal is input to the control signal lines 27 of the other bit line control circuits 25a, 25b and 25d. Therefore, a plurality of bit lines 5 corresponding to a bit select line 8 selected in the first column address decoder 23 can be selected in the first, second and third bit selector blocks 7 and can be respectively set to an active state, and a plurality of bit lines 5 corresponding to a bit select line 8 selected in the second column address decoder 24 can be selected in the fourth bit selector block 7 and can be respectively set to an active state.

Thereafter, in the access operation, the first bit select line 8 from the top is selected in the first column address decoder 23 to select the first bit lines 5 from the left in the bit selectors 17 of the first, second and third bit selector blocks 7, the second bit select line 8 from the top is selected in the second column address decoder 24 to select the second bit lines 5 from the left in the bit selectors 17 of the fourth bit selector block 7, and the first word line 4 from the top is selected in the row address decoder 22. Therefore, the first bit lines 5 from the left and the first word line 4 from the top connected with twenty-four memory cells 16 of the addresses "01" to "03" in the first, second and third bit selector blocks 7 are respectively set to an active state, the second bit lines 5 from the left and the first word line 4 from the top connected with eight memory cells 16 of the address "04" in the fourth bit selector block 7 (or the remaining bit selector block 7) are respectively set to an active state, and thirty-two pieces of one-bit data are read out from or written in the thirty-two memory cells of the addresses "01" to "04" as 32-bit data.

Accordingly, 32-bit data can be read out from or written in the memory cell array 2 every access operation in case of the second addressing arrangement.

Next, an operation of reading out or writing 32-bit data corresponding to the 32-bit width of the memory cell array 2 in the row direction from/in thirty-two memory cells 16, to which the addresses starting from the third address "02" and ending to the sixth address "05" are assigned, will be described. The top memory cell 16 among the memory cells 16 of the third address "02" is placed in the middle of the memory cells 16 of the first row. Eight memory cells 16 of the sixth address "5" are placed in the third memory cell block 3 and are connected with the second bit lines from the left in the bit selectors 17 and the first word line 4 from the top.

In an access operation, the L signal is input to the control signal line 27 of the second bit line control circuit 25b, and the H signal is input to the control signal lines 27 of the other bit line control circuits 25a, 25c and 25d. Thereafter, the first bit select line 8 from the top is selected in the first column address decoder 23 to select the first bit lines 5 from the left in the bit selectors 17 of the first and second bit selector blocks 7, the second bit select line 8 from the top is selected in the second column address decoder 24 to select the second bit lines 5 from the left in the bit selectors 17 of the third and fourth bit selector blocks 7, and the first word line 4 from the top is selected in the row address decoder 22. Therefore, the first bit lines 5 from the left and the first word line 4 from the top connected with sixteen memory cells 16 of the addresses "02" and "03" in the first and second bit selector blocks 7 are respectively set to an active state, the second bit lines 5 from the left and the first word line 4 from the top connected with sixteen memory cells 16 of the addresses "04" and "05" in the third and fourth bit selector blocks 7 (or the remaining bit selector blocks 7) are respectively set to an active state, and thirty-two pieces of one-bit data are read out from or written in the thirty-two memory cells 16 of the addresses "02" to "05" as 32-bit data.

Accordingly, 32-bit data can be read out from or written in the memory cell array 2 every access operation in case of the second addressing arrangement.

Next, an operation of reading out or writing 32-bit data corresponding to the 32-bit width of the memory cell array 2 in the row direction from/in thirty-two memory cells 16, to which the addresses starting from the fourth address "03" and ending to the seventh address "06" are assigned, will be described. The top memory cell 16 among the memory cells 16 of the fourth address "03" is placed in the middle of the memory cells 16 of one row. Eight memory cells 16 of the seventh address "6" are placed in the second memory cell block 3 and are connected with the second bit lines from the left in the bit selectors 17 and the first word line 4 from the top.

In an access operation, the L signal is input to the control signal line 27 of the second bit line control circuit 25a, and the H signal is input to the control signal lines 27 of the other bit line control circuits 25b, 25c and 25d. Thereafter, the first bit select line 8 from the top is selected in the first column address decoder 23 to select the first bit lines 5 from the left in the bit selectors 17 of the first bit selector block 7, the second bit select line 8 from the top is selected in the second column address decoder 24 to select the second bit lines 5 from the left in the bit selectors 17 of the second, third and fourth bit selector blocks 7, and the first word line 4 from the top is selected in the row address decoder 22. Therefore, the first bit lines 5 from the left and the first word line 4 from the top connected with eight memory cells 16 of the address "03" in the first bit selector block 7 are respectively set to an active state, the second bit lines 5 from the left and the first word line 4 from the top connected with twenty-four memory cells 16 of the addresses "04" and "06" in the second, third and fourth bit selector blocks 7 (or the remaining bit selector blocks 7) are respectively set to an active state, and thirty-two pieces of one-bit data are read out from or written in the thirty-two memory cells 16 of the addresses "03" to "06" as 32-bit data.

Accordingly, 32-bit data can be read out from or written in the memory cell array 2 every access operation in case of the second addressing arrangement.

As is described above, in the second embodiment, the memory cell array 2 is divided into the memory cell blocks 3 respectively having the 8-bit width in the row direction, the bit selector array 6 is divided into the bit selector blocks 7, each bit selector block 7 has the bit selectors 17 of which the number is equal to eight corresponding to the 8-bit width of the corresponding memory cell block 3. Also, the first column address decoder 23 is connected with one end of each bit select line 8, and a bit select line 8 is selected in the first column address decoder 23 to make each bit selector 17 of one bit selector block 7 or bit selector blocks 7 select a bit line. Also, the second column address decoder 24 is connected with the other end of each bit select line 8, and a specific bit select line 8 is selected in the second column address decoder 24 to make each bit selector 17 of the remaining bit selector block 7 or the remaining bit selector blocks 7 select a specific bit line 5 corresponding to a specific address group which is higher than an address group of a bit line of the bit selector 17 corresponding to the bit select line 8 selected in the first column address decoder 23 and is nearest to the address group of the bit line corresponding to the bit select line 8 selected in the first column address decoder 23 among address groups corresponding to all the bit lines 5 of the bit selector 17. Also, the bit line control circuits 26 are disposed between the bit selector blocks adjacent to each other and between the bit selector block 7 and the second column address decoder 24 to determine the remaining bit selector block(s) 7 in which the bit selectors 17 select the specific bit lines 5 according to the specific bit select line 8 selected in the second column address decoder 24.

Therefore, when one bit line control circuit 26 is set to electrically disconnect the bit selector blocks 7 adjacent to the bit line control circuit 26 from each other while setting the other bit line control circuits 26 to electrically connect the bit selector blocks 7 and the second column address decoder 24 adjacent to the other bit line control circuits 26, pieces of data corresponding to the bit width of the memory cell array 2 can be read out from or written in a plurality of memory cells 16 of the memory cell array 2 in one access operation even though the top memory cell 16 placed at the top among the memory cells 16 is placed in the middle of a row of memory cells.

Embodiment 3

FIG. 3 is a block diagram showing the configuration of a semiconductor storing device according to a third embodiment of the present invention. The constituent elements, which are the same as those shown in FIG. 1, are indicated by the same reference numerals as those of the constituent elements shown in FIG. 1, and additional description of those constituent elements is omitted.

Figure 10:
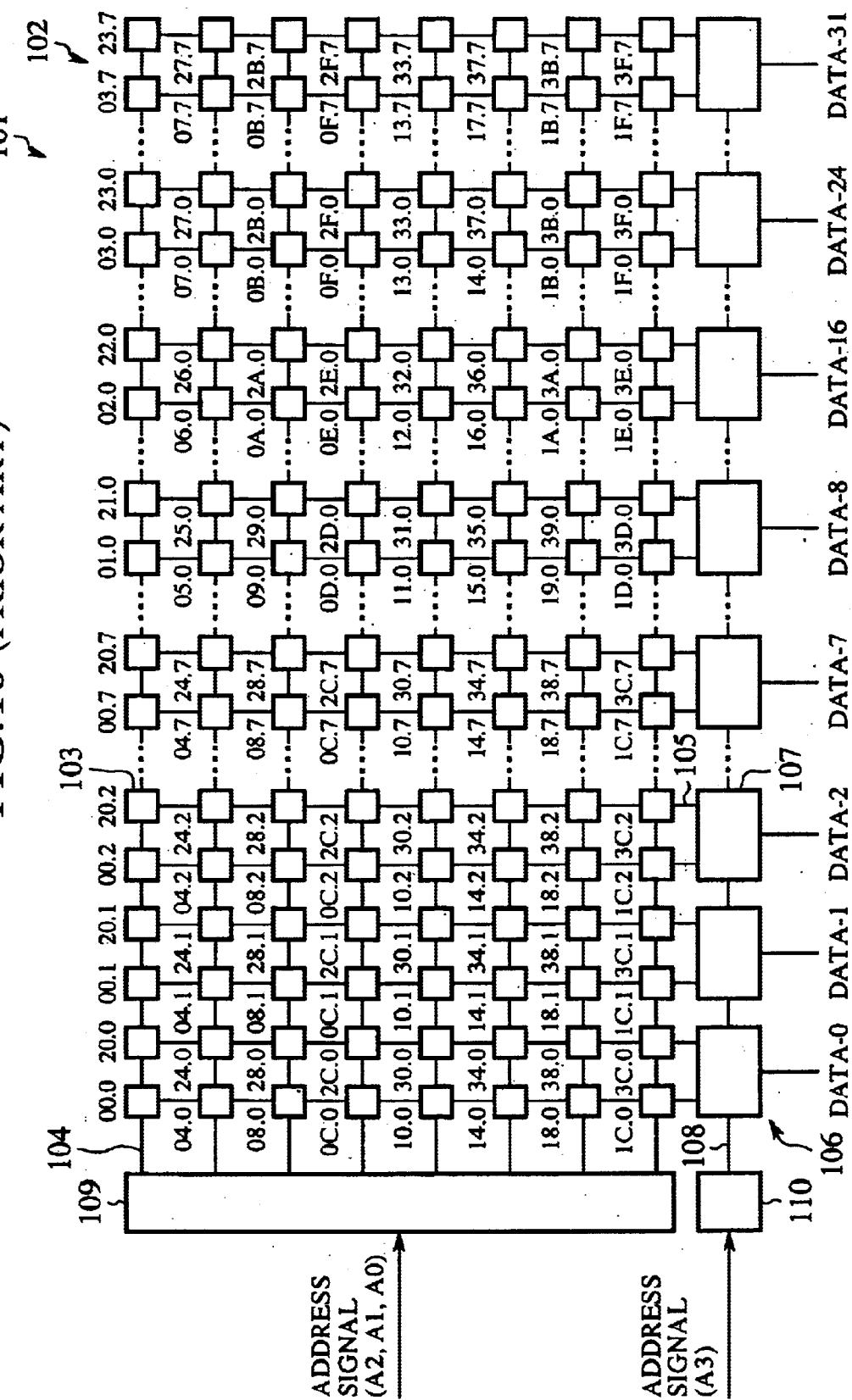
FIG. 10 is a view showing a first addressing arrangement in which addresses are assigned to memory cells of a memory cell array shown in FIG. 9.

In FIG. 3, in the same manner as in the first embodiment, the addresses are assigned to the memory cells 16 (refer to FIG. 1B) of the memory cell array 2 according to the first addressing arrangement shown in FIG. 10. 31 indicates a semiconductor storing device. 32 indicates a row address decoder connected with one end of each word line 4. An address signal is sent from the outside, a row address signal included in the address signal is received in the row address decoder 32, and one of the word lines 4 is selected in the row address decoder 32 according to the row address signal. 33 indicates a column address decoder connected with one end of each bit select line 8. A column address signal included in the address signal is received in the column address decoder 33, and one of the bit select lines 8 is selected in the column address decoder 33 according to the column address signal.

34a indicates a first word line changing circuit (or a word line changing unit) connected with the group of word lines 4 of the first memory cell block 3 nearest to the row address decoder 32 and the group of word lines 4 of the second memory cell block 3. 34b indicates a second word line changing circuit (or the word line changing unit) connected with the group of word lines 4 of the second memory cell block 3 and the group of word lines 4 of the third memory cell block 3. 34c indicates a third word line changing circuit (or the word line changing unit) connected with the group of word lines 4 of the third memory cell block 3 and the group of word lines 4 of the fourth memory cell block 3. Each of the word line changing circuits 34a to 34d is composed of a plurality of first NMOS transistors 35 in which source electrodes and drain electrodes are connected with the word lines 4 in one-to-one correspondence, a plurality of auxiliary word lines 36 respectively connecting the input end of the first NMOS transistor 35 of one word line 4 of a first address group and the output end of the first NMOS transistor 35 of another word line 4 of a specific address group on condition that the specific address group is higher than the first address group and is nearest to the first address group among address groups of the all the word lines 4, a plurality of second NMOS transistors 37 in which source electrodes and drain electrodes are connected with the auxiliary word lines 36 in one-to-one correspondence, a first control signal line 38 connected with gate electrodes of the first NMOS transistors 35, a second control signal line 39 connected with gate electrodes of the second NMOS transistors 37, and an NOT circuit 40 connecting the first control signal line 38 and the second control signal line 39. A control signal input to each first control signal line 38 is inverted into an inverted control signal in the corresponding NOT circuit 40, and the inverted control signal is input to the gate electrodes of the corresponding second NMOS transistors 37 through the corresponding second control signal line 39. In this embodiment, each auxiliary word line 36 connects one pair of word lines 4 adjacent to each other.

As a first example, an L signal of a low level is input to the first control signal line 38 of the first word line changing circuit 34a to turn off the first NMOS transistors 35 of the first word line changing circuit 34a and to turn on the second NMOS transistors 37 of the first word line changing circuit 34a, and an H signal of a high level is input to the first control signal lines 38 of the other word line changing circuits 34b and 34c to turn on the first NMOS transistors 35 of the other word line changing circuits 34b and 34c and to turn off the second NMOS transistors 37 of the other word line changing circuits 34b and 34c. Therefore, when one word line 4 is selected in the row address decoder 32, the selected word line 4 is set to an active state in the first memory cell block 3 placed on the side of the row address decoder 32 from the first word line changing circuit 34a, and a specific word line 4 corresponding to a specific address group, which is higher than an address group of the word line 4 selected in the row address decoder 32 and is nearest to the address group of the word line 4 among address groups of all the word lines 4, is set to an active state in the second, third and fourth memory cell blocks 3 placed on the opposite side of the row address decoder 32 from the first word line changing circuit 34a.

As a second example, an L signal is input to the first control signal line 38 of the second word line changing circuit 34b to turn off the first NMOS transistors 35 of the second word line changing circuit 34b and to turn on the second NMOS transistors 37 of the second word line changing circuit 34b, and an H signal is input to the first control signal lines 38 of the other word line changing circuits 34a and 34c to turn on the first NMOS transistors 35 of the other word line changing circuits 34a and 34c and to turn off the second NMOS transistors 37 of the other word line changing circuits 34a and 34c. Therefore, when one word line 4 is selected in the row address decoder 32, the selected word line 4 is set to an active state in the first and second memory cell blocks 3 placed on the side of the row address decoder 32 from the second word line changing circuit 34b, and a specific word line 4 corresponding to a specific address group, which is higher than an address group of the word line 4 selected in the row address decoder 32 and is nearest to the address group of the word line 4 among address groups of all the word lines 4, is set to an active state in the third and fourth memory cell blocks 3 placed on the opposite side of the row address decoder 32 from the second word line changing circuit 34b.

As a third example, an L signal is input to the first control signal line 38 of the third word line changing circuit 34c to turn off the first NMOS transistors 35 of the third word line changing circuit 34c and to turn on the second NMOS transistors 37 of the third word line changing circuit 34c, and an H signal is input to the first control signal lines 38 of the other word line changing circuits 34a and 34b to turn on the first NMOS transistors 35 of the other word line changing circuits 34a and 34b and to turn off the second NMOS transistors 37 of the other word line changing circuits 34a and 34b. Therefore, when one word line 4 is selected in the row address decoder 32, the selected word line 4 is set to an active state in the first, second and third memory cell blocks 3 placed on the side of the row address decoder 32 from the third word line changing circuit 34c, and a specific word line 4 corresponding to a specific address group, which is higher than an address group of the word line 4 selected in the row address decoder 32 and is nearest to the address group of the word line 4 among address groups of all the word lines 4, is set to an active state in the fourth memory cell block 3 placed on the opposite side of the row address decoder 32 from the third word line changing circuit 34c.

Next, an operation of the semiconductor storing device 31 will be described.

An operation of reading out or writing 32-bit data corresponding to the 32-bit width of the memory cell array 2 in the row direction from/in thirty-two memory cells 16, to which addresses ranging from the first address "00" to the fourth address "03" are assigned, will be initially described.

The H signal is input to the first control signal lines 38 of the word line changing circuits 34a to 34c. In this case, the first NMOS transistors 35 of the word line changing circuits 34a to 34c are turned on, and the second NMOS transistors 37 of the word line changing circuits 34a to 34c are turned off. Therefore, a word line 4 selected in the row address decoder 32 can be set to an active state in the first, second, third and fourth memory cell blocks 3.

Thereafter, the first word line 4 from the top is selected in the row address decoder 32, and the first bit select line 8 from the top is selected in the column address decoder 33 to select the first bit line 5 from the left in each bit selector 17 of the bit selector blocks 7. Therefore, the first word line 4 and the first bit lines 5 connected with thirty-two memory cells 16 of the addresses "00" to "03" in the first, second, third and fourth memory cell blocks 3 are respectively set to an active state, and thirty-two pieces of one-bit data are read out from or written in the thirty-two memory cells 16 of the addresses "00" to "03" as 32-bit data. In this case, because there in no remaining memory cell block, no word line different from the word line 4 selected in the row address decoder 32 is set to an active state.

Accordingly, 32-bit data can be read out from or written in the memory cell array 2 every access operation in case of the first addressing arrangement.

Next, an operation of reading out or writing 32-bit data corresponding to the 32-bit width of the memory cell array 2 in the row direction from/in thirty-two memory cells 16, to which addresses ranging from the second address "01" to the fifth address "04" are assigned, will be described. The top memory cell 16 among the memory cells 16 of the second address "01" is placed in the middle of the memory cells 16 of one row.

In this case, the L signal is input to the first control signal line 38 of the third word line changing circuit 34c, and the H signal is input to the first control signal lines 38 of the first and second word line changing circuits 34a and 34b. Therefore, the first NMOS transistors 35 of the third word line changing circuit 34c are turned off, the second NMOS transistors 37 of the third word line changing circuit 34c are turned on, the first NMOS transistors 35 of the word line changing circuits 34a and 34b are turned on, and the second NMOS transistors 37 of the word line changing circuits 34a and 34b are turned off. In this case, a word line 4 selected in the row address decoder 32 can be set to an active state in the first, second and third memory cell blocks 3, and a specific word line 4 corresponding to a specific address group, which is higher than an address group of the word line 4 selected in the row address decoder 32 and is nearest to the address group of the word line 4 among address groups of all word lines 4, can be set to an active state in the fourth memory cell block 3.

Thereafter, the first word line 4 from the top is selected in the row address decoder 32, and the first bit select line 8 from the top is selected in the column address decoder 33 to select the first bit line 5 from the left in each bit selector 17 of the bit selector blocks 7. In this case, the word line 4 selected in the row address decoder 32 is set to an active state in the first, second and third memory cell blocks 3, and the second word line 4 from the top is set to an active state in the fourth memory cell block 3. Therefore, the first word line 4 and the first bit lines 5 connected with twenty-four memory cells 16 of the addresses "01" to "03" in the first, second and third memory cell blocks 3 are respectively set to an active state, the second word line 4 from the top and the first bit lines 5 connected with eight memory cells 16 of the address "04" in the fourth memory cell block 3 (or the remaining memory cell block 3) are respectively set to an active state, and thirty-two pieces of one-bit data are read out from or written in the thirty-two memory cells 16 of the addresses "01" to "04" as 32-bit data.

Accordingly, 32-bit data can be read out from or written in the memory cell array 2 every access operation in case of the first addressing arrangement.

Next, an operation of reading out or writing 32-bit data corresponding to the 32-bit width of the memory cell array 2 in the row direction from/in thirty-two memory cells 16, to which addresses ranging from the third address "02" to the sixth address "05" are assigned, will be described. The top memory cell 16 among the memory cells 16 of the third address "02" is placed in the middle of the memory cells 16 of one row.

In this case, the L signal is input to the first control signal line 38 of the second word line changing circuit 34b, and the H signal is input to the first control signal lines 38 of the word line changing circuits 34a and 34c. Therefore, the first NMOS transistors 35 of the second word line changing circuit 34b are turned off, the second NMOS transistors 37 of the second word line changing circuit 34b are turned on, the first NMOS transistors 35 of the word line changing circuits 34a and 34c are turned on, and the second NMOS transistors 37 of the word line changing circuits 34a and 34c are turned off.

Thereafter, the first word line 4 from the top is selected in the row address decoder 32, and the first bit select line 8 from the top is selected in the column address decoder 33 to select the first bit line 5 from the left in each bit selector 17 of the bit selector blocks 7. In this case, the word line 4 selected in the row address decoder 32 is set to an active state in the first and second memory cell blocks 3, and the second word line 4 from the top is set to an active state in the third and fourth memory cell blocks 3. Therefore, the first word line 4 and the first bit lines 5 connected with sixteen memory cells 16 of the addresses "02" to "03" in the first and second memory cell blocks 3 are respectively set to an active state, the second word line 4 from the top and the first bit lines 5 connected with sixteen memory cells 16 of the addresses "04" and "05" in the third and fourth memory cell block 3 (or the remaining memory cell blocks 3) are respectively set to an active state, and thirty-two pieces of one-bit data are read out from or written in the thirty-two memory cells 16 of the addresses "02" to "05" as 32-bit data.

Accordingly, 32-bit data can be read out from or written in the memory cell array 2 every access operation in case of the first addressing arrangement.

Next, an operation of reading out or writing 32-bit data corresponding to the 32-bit width of the memory cell array 2 in the row direction from/in thirty-two memory cells 16, to which addresses ranging from the fourth address "03" to the seventh address "06" are assigned, will be described. The top memory cell 16 among the memory cell 16 of the fourth address "03" is placed in the middle of the memory cells 16 of one row.

In this case, the L signal is input to the first control signal line 38 of the first word line changing circuit 34a, and the H signal is input to the first control signal lines 38 of the word line changing circuits 34b and 34c. Therefore, the first NMOS transistors 35 of the first word line changing circuit 34a are turned off, the second NMOS transistors 37 of the first word line changing circuit 34a are turned on, the first NMOS transistors 35 of the word line changing circuits 34b and 34c are turned on, and the second NMOS transistors 37 of the word line changing circuits 34b and 34c are turned off.

Thereafter, the first word line 4 from the top is selected in the row address decoder 32, and the first bit select line 8 from the top is selected in the column address decoder 33 to select the first bit line 5 from the left in each bit selector 17 of the bit selector blocks 7. In this case, the word line 4 selected in the row address decoder 32 is set to an active state in the first memory cell block 3, and the second word line 4 from the top is set to an active state in the second, third and fourth memory cell blocks 3. Therefore, the first word line 4 and the first bit lines 5 connected with eight memory cells 16 of the address "03" in the first memory cell block 3 are respectively set to an active state, the second word line 4 from the top and the first bit lines 5 connected with twenty-four memory cells 16 of the addresses "04" and "06" in the second, third and fourth memory cell block 3 (or the remaining memory cell blocks 3) are respectively set to an active state, and thirty-two pieces of one-bit data are read out from or written in the thirty-two memory cells 16 of the addresses "03" to "06" as 32-bit data.

Accordingly, 32-bit data can be read out from or written in the memory cell array 2 every access operation in case of the first addressing arrangement.

As is described above, in the third embodiment, the memory cell array 2 is divided into the memory cell blocks 3 respectively having the 8-bit width in the row direction, and each of the word line changing circuits 34a to 34c is disposed between the memory cell blocks 3 adjacent to each other to be connected with the word lines 4 extending from the memory cell blocks 3. Therefore, because of the function of the word line changing circuits 34a to 34c, one word line 4 selected in the row address decoder 32 is set to an active state in one memory cell block 3 or a plurality of memory cell blocks placed on the side of the row address decoder 32, and a specific word line 4 corresponding to a specific address group, which is higher than an address group of the word line 4 selected in the row address decoder 32 and is nearest to the address group of the word line 4 among address groups of all the word lines 4, is set to an active state in the remaining memory cell block 3 or the remaining memory cell blocks 3.

Therefore, pieces of data corresponding to the bit width of the memory cell array 2 can be read out from or written in a plurality of memory cells 16 of the memory cell array 2 in one access operation even though the top memory cell 16 placed at the top among the memory cells 16 is placed in the middle of a row of memory cells.

Embodiment 4

Figure 4:
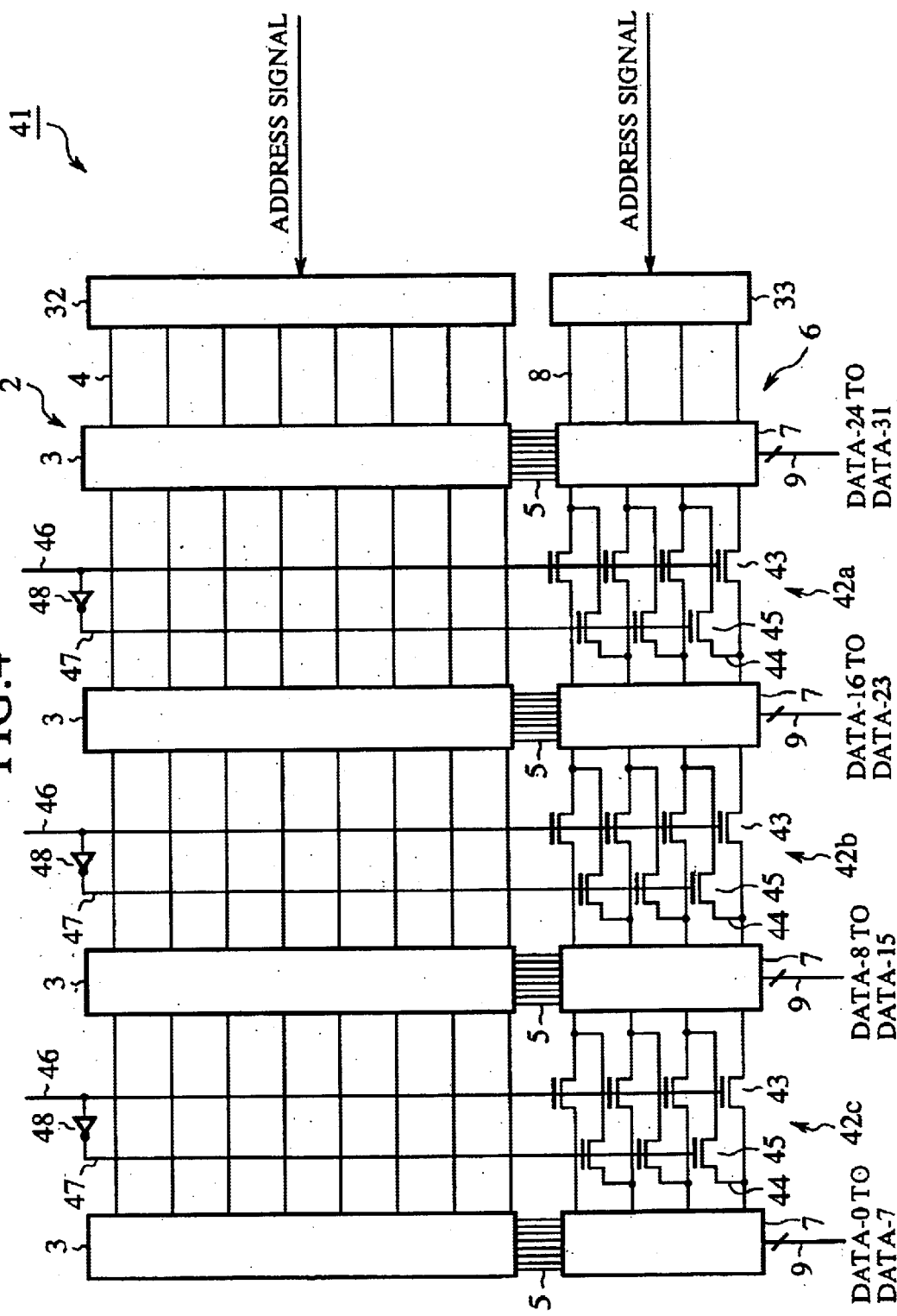
FIG. 4 is a block diagram showing the configuration of a semiconductor storing device according to a fourth embodiment of the present invention.

FIG. 4 is a block diagram showing the configuration of a semiconductor storing device according to a fourth embodiment of the present invention. The constituent elements, which are the same as those shown in FIG. 3, are indicated by the same reference numerals as those of the constituent elements shown in FIG. 3, and additional description of those constituent elements is omitted.

In FIG. 4, in the same manner as in the second embodiment, the addresses are assigned to the memory cells 16 (refer to FIG. 1B) of the memory cell array 2 according to the second addressing arrangement shown in FIG. 11. 41 indicates a semiconductor storing device. 42a indicates a first bit line changing circuit (or a bit line control unit) connected with the group of bit select lines 8 of the first bit selector block 7 and the group of bit select lines 8 of the second bit selector block 7. 42b indicates a second bit line changing circuit (or the bit line control unit) connected with the group of bit select lines 8 of the second bit selector block 7 and the group of bit select lines 8 of the third bit selector block 7. 42c indicates a third bit line changing circuit (or the bit line control unit) connected with the group of bit select lines 8 of the third bit selector block 7 and the group of bit select lines 8 of the fourth bit selector block 7. Each of the bit line changing circuits 42a to 42c is composed of a plurality of first NMOS transistors 43 in which source electrodes and drain electrodes are connected with the bit select lines 8 in one-to-one correspondence, a plurality of auxiliary word lines 44 respectively connecting the input end of the first NMOS transistor 43 of one bit select line 8 corresponding to one bit line 5 of a first address group in one bit selector 17 and the output end of the first NMOS transistor 43 of another bit select line 8 corresponding to another bit line 5 of a specific address group in the bit selector 17 on condition that the specific address group is higher than the first address group and is nearest to the first address group among address groups of all the bite lines 5 of the bit selector 17, a second NMOS transistor 45 of which source electrodes and drain electrodes are connected with the auxiliary word lines 44 in one-to-one correspondence, a first control signal line 46 connected with gate electrodes of the first NMOS transistors 43, a second control signal line 47 connected with gate electrodes of the second NMOS transistors 45, and an NOT circuit 48 connecting the first control signal line 46 and the second control signal line 47. A control signal input to each first control signal line 46 is inverted into an inverted control signal in the corresponding NOT circuit 48, and the inverted control signal is input to the gate electrodes of the corresponding second NMOS transistors 45 through the corresponding second control signal line 47. In this embodiment, each auxiliary word line 44 connects one pair of first NMOS transistors 43 adjacent to each other.

As a first example, an L signal of a low level is input to the first control signal line 46 of the first bit line changing circuit 42a to turn off the first NMOS transistors 43 of the first bit line changing circuit 42a and to turn on the second NMOS transistors 45 of the first bit line changing circuit 42a, and an H signal of a high level is input to the first control signal lines 46 of the other bit line changing circuits 42b and 42c to turn on the first NMOS transistors 43 of the other bit line changing circuits 42b and 42c and to turn off the second NMOS transistors 45 of the other bit line changing circuits 42b and 42c. Therefore, when one bit select line 8 is selected in the column address decoder 33, the selected bit select line 8 is set to an active state in the first bit selector block 7 placed on the side of the column address decoder 33 from the first bit line changing circuit 42a. Also, in each bit selector 17 of the second, third and fourth bit selector blocks 7 placed on the opposite side of the column address decoder 33 from the first bit line changing circuit 42a, a specific bit line 5 corresponding to a specific address group, which is higher than that of a bit line 5 corresponding to the bit select line 8 selected in the column address decoder 33 and is nearest to that of the bit line 5 among address groups of all the bit lines 5 of the bit selector 17, is set to an active state.

As a second example, an L signal is input to the first control signal line 46 of the second bit line changing circuit 42b to turn off the first NMOS transistors 43 of the second bit line changing circuit 42b and to turn on the second NMOS transistors 45 of the second bit line changing circuit 42b, and an H signal is input to the first control signal lines 46 of the other bit line changing circuits 42a and 42c to turn on the first NMOS transistors 43 of the other bit line changing circuits 42b and 42c and to turn off the second NMOS transistors 45 of the other bit line changing circuits 42a and 42c. Therefore, when one bit select line 8 is selected in the column address decoder 33, the selected bit select line 8 is set to an active state in the first and second bit selector blocks 7 placed on the side of the column address decoder 33 from the second bit line changing circuit 42b. Also, in each bit selector 17 of the third and fourth bit selector blocks 7 placed on the opposite side of the column address decoder 33 from the second bit line changing circuit 42b, a specific bit line 5 corresponding to a specific address group, which is higher than that of a bit line 5 corresponding to the bit select line 8 selected in the column address decoder 33 and is nearest to that of the bit line 5 among address groups of all the bit lines 5 of the bit selector 17, is set to an active state.

As a third example, an L signal is input to the first control signal line 46 of the third bit line changing circuit 42c to turn off the first NMOS transistors 43 of the third bit line changing circuit 42c and to turn on the second NMOS transistors 45 of the third bit line changing circuit 42c, and an H signal is input to the first control signal lines 46 of the other bit line changing circuits 42a and 42b to turn on the first NMOS transistors 43 of the other bit line changing circuits 42b and 42b and to turn off the second NMOS transistors 45 of the other bit line changing circuits 42a and 42b. Therefore, when one bit select line 8 is selected in the column address decoder 33, the selected bit select line 8 is set to an active state in the first, second and third bit selector blocks 7 placed on the side of the column address decoder 33 from the third bit line changing circuit 42c. Also, in each bit selector 17 of the fourth bit selector block 7 placed on the opposite side of the column address decoder 33 from the third bit line changing circuit 42c, a specific bit line 5 corresponding to a specific address group, which is higher than that of a bit line 5 corresponding to the bit select line 8 selected in the column address decoder 33 and is nearest to that of the bit line 5 among address groups of all the bit lines 5 of the bit selector 17, is set to an active state.

In the semiconductor storing device 41 according to this embodiment, a plurality of memory cells 16 (refer to FIG. 1B) are arranged in each memory cell block 3 in a matrix of 8 rows and 32 columns (N=4) as an example. The number of word lines 4 is equal to eight. The number of memory cells 16 connected with each word line 4 is equal to 32×4. The number of bit lines 5 is equal to 32×4. Each bit line 5 is connected with eight memory cells 16. Each bit selector 17 (refer to FIG. 1C) is connected with a group of four bit lines 5. Each group of four bit lines 5 connected with one bit selector 17 is shown by one line in FIG. 4. The number of bit selector lines 8 is equal to four. The first, second, third and fourth bit select lines 8 from the top correspond to the first, second, third and fourth bit lines 5 from the left respectively in each bit selector 17.

Next, an operation of the semiconductor storing device 41 will be described.

An operation of reading out or writing 32-bit data corresponding to the 32-bit width of the memory cell array 2 in the row direction from/in thirty-two memory cells 16, to which addresses ranging from the first address "00" to the fourth address "03" are assigned, will be initially described.

The H signal is input to the first control signal lines 46 of the bit line changing circuits 42a to 42c. In this case, the first NMOS transistors 43 of the bit line changing circuits 42a to 42c are turned on, and the second NMOS transistors 45 of the bit line changing circuits 42a to 42c are turned off. Therefore, thirty-two bit lines 5 selected in the bit selectors 17 of the bit selector blocks 7 according to a bit select line 8 selected in the column address decoder 33 can be set to an active state.

Thereafter, the first bit select line 8 from the top is selected in the column address decoder 33 to select the first bit lines 5 from the left in the bit selectors 17 of the bit selector blocks 7, and the first word line 4 from the top is selected in the row address decoder 32. Therefore, the first bit lines 5 from the left and the first word line 4 from the top connected with thirty-two memory cells 16 of the addresses "00" to "03" are respectively set to an active state, and thirty-two pieces of one-bit data are read out from or written in the thirty-two memory cells 16 of the addresses "00" to "03" as 32-bit data.

Accordingly, 32-bit data can be read out from or written in the memory cell array 2 every access operation in case of the second addressing arrangement.

Next, an operation of reading out or writing 32-bit data corresponding to the 32-bit width of the memory cell array 2 in the row direction from/in thirty-two memory cells 16, to which addresses ranging from the second address "01" to the fifth address "04" are assigned, will be described. The top memory cell 16 among the memory cells 16 of the second address "01" is placed in the middle of the memory cells 16 of the first row.

In this case, the L signal is input to the control signal line 46 of the third bit line control circuit 42c, and the H signal is input to the control signal lines 46 of the other bit line control circuits 42a and 42b. Therefore, twenty-four bit lines 5 corresponding to a bit select line 8 selected in the column address decoder 33 can be selected in the bit selectors 17 of the first, second and third bit selector blocks 7 and can be respectively set to an active state. Also, in each bit selector 17 of the fourth bit selector block 7, a specific bit line 5 corresponding to an address group, which is higher than that of a bit line 5 corresponding to the bit select line 8 selected in the column address decoder 33 and is nearest to that of the bit line 5 among address groups of all the bit lines 5 of the bit selector 17, can be set to an active state.

Thereafter, the first bit select line 8 from the top is selected in the column address decoder 33 to select the first bit lines 5 from the left in the bit selectors 17 of the first, second and third bit selector blocks 7 and to select the second bit lines 5 from the left in the bit selectors 17 of the fourth bit selector blocks 7, and the first word line 4 from the top is selected in the row address decoder 32. Therefore, the first bit lines 5 from the left are respectively set to an active state in the first, second and third memory cell blocks 3, the second bit lines 5 from the left are respectively set to an active state in the fourth memory cell block 3, and the first word line 4 from the top is set to an active state in the memory cell blocks 3. In other words, the first bit lines 5 from the left and the first word line 4 from the top connected with twenty-four memory cells 16 of the addresses "01" to "03" in the first, second and third bit selector blocks 7 are respectively set to an active state, the second bit lines 5 from the left and the first word line 4 from the top connected with eight memory cells 16 of the address "04" in the fourth bit selector block 7 (or the remaining bit selector block 7) are respectively set to an active state, and thirty-two pieces of one-bit data are read out from or written in the thirty-two memory cells 16 of the addresses "01" to "04" as 32-bit data.

Accordingly, 32-bit data can be read out from or written in the memory cell array 2 every access operation in case of the second addressing arrangement.

Next, an operation of reading out or writing 32-bit data corresponding to the 32-bit width of the memory cell array 2 in the row direction from/in thirty-two memory cells 16, to which addresses ranging from the third address "02" to the sixth address "05" are assigned, will be described. The top memory cell 16 among the memory cells 16 of the third address "02" is placed in the middle of the memory cells 16 of the first row.

In this case, the L signal is input to the control signal line 46 of the second bit line control circuit 42b, and the H signal is input to the control signal lines 46 of the other bit line control circuits 42a and 42c. Therefore, sixteen bit lines 5 corresponding to a bit select line 8 selected in the column address decoder 33 can be selected in the bit selectors 17 of the first and second bit selector blocks 7 and can be respectively set to an active state. Also, in each bit selector 17 of the third and fourth bit selector blocks 7, a specific bit line 5 corresponding to an address group, which is higher than that of a bit line 5 corresponding to the bit select line 8 selected in the column address decoder 33 and is nearest to that of the bit line 5 among address groups of all the bit lines 5 of the bit selector 17, can be set to an active state.

Thereafter, the first bit select line 8 from the top is selected in the column address decoder 33 to select the first bit lines 5 from the left in the bit selectors 17 of the first and second bit selector blocks 7, and the first word line 4 from the top is selected in the row address decoder 32. Therefore, the first bit lines 5 from the left and the first word line 4 from the top connected with sixteen memory cells 16 of the addresses "02" to "03" in the first and second bit selector blocks 7 are respectively set to an active state, the second bit lines 5 from the left and the first word line 4 from the top connected with sixteen memory cells 16 of the address "04" to "05" in the third and fourth bit selector blocks 7 (or the remaining bit selector blocks 7) are respectively set to an active state, and thirty-two pieces of one-bit data are read out from or written in the thirty-two memory cells 16 of the addresses "02" to "05" as 32-bit data.

Accordingly, 32-bit data can be read out from or written in the memory cell array 2 every access operation in case of the second addressing arrangement.

Next, an operation of reading out or writing 32-bit data corresponding to the 32-bit width of the memory cell array 2 in the row direction from/in thirty-two memory cells 16, to which addresses ranging from the fourth address "03" to the seventh address "06" are assigned, will be described. The top memory cell 16 among the memory cell 16 of the fourth address "03" is placed in the middle of the memory cells 16 of the first row.

In this case, the L signal is input to the control signal line 46 of the first bit line control circuit 42a, and the H signal is input to the control signal lines 46 of the other bit line control circuits 42b and 42c. Therefore, eight bit lines 5 corresponding to a bit select line 8 selected in the column address decoder 33 can be selected in the bit selectors 17 of the first bit selector block 7 and can be respectively set to an active state. Also, in each bit selector 17 of the second, third and fourth bit selector blocks 7, a specific bit line 5 corresponding to an address group, which is higher than that of a bit line 5 corresponding to the bit select line 8 selected in the column address decoder 33 and is nearest to that of the bit line 5 among address groups of all the bit lines 5 of the bit selector 17, can be set to an active state.

Thereafter, the first bit select line 8 from the top is selected in the column address decoder 33 to select the first bit lines 5 from the left in the bit selectors 17 of the first bit selector blocks 7, and the first word line 4 from the top is selected in the row address decoder 32. Therefore, the first bit lines 5 from the left and the first word line 4 from the top connected with eight memory cells 16 of the address "03" in the first bit selector blocks 7 are respectively set to an active state, the second bit lines 5 from the left and the first word line 4 from the top connected with twenty-four memory cells 16 of the address "04" to "06" in the second, third and fourth bit selector blocks 7 (or the remaining bit selector blocks 7) are respectively set to an active state, and thirty-two pieces of one-bit data are read out from or written in the thirty-two memory cells 16 of the addresses "03" to "06" as 32-bit data.

Accordingly, 32-bit data can be read out from or written in the memory cell array 2 every access operation in case of the second addressing arrangement.

As is described above, in the fourth embodiment, the memory cell array 2 is divided into the memory cell blocks 3 respectively having the 32-bit width in the row direction, the bit selector array 6 is divided into the bit selector blocks 7, each bit selector block 7 has the bit selectors 17 of which the number is equal to eight corresponding to the 8-bit width of the corresponding memory cell block 3. Also, each of the bit line changing circuits 42a to 42c is connected with the bit select lines 8 extending from the corresponding pair of bit selector blocks 7 adjacent to each other. In each bit selector 17 of one bit selector block 7 or bit selector blocks 7 placed on the side of the column address decoder 33, the bit line 5 corresponding to the bit select line 8 selected in the column address decoder 33 is set to an active state. In each bit selector 17 of the remaining bit selector block 7 or the remaining bit selector blocks 7, a specific bit line 5 corresponding to an address group, which is higher than that of the bit line 5 corresponding to the bit select line 8 selected in the column address decoder 33 and is nearest to that of the bit line 5 among address groups of all the bit lines 5 of the bit selector 17, is selected to set the specific bit line 5 to an active state.

Therefore, pieces of data corresponding to the bit width of the memory cell array 2 can be read out from or written in a plurality of memory cells 16 of the memory cell array 2 in one access operation even though the top memory cell 16 placed at the top among the memory cells 16 is placed in the middle of a row of memory cells.

Embodiment 5

Figure 5:
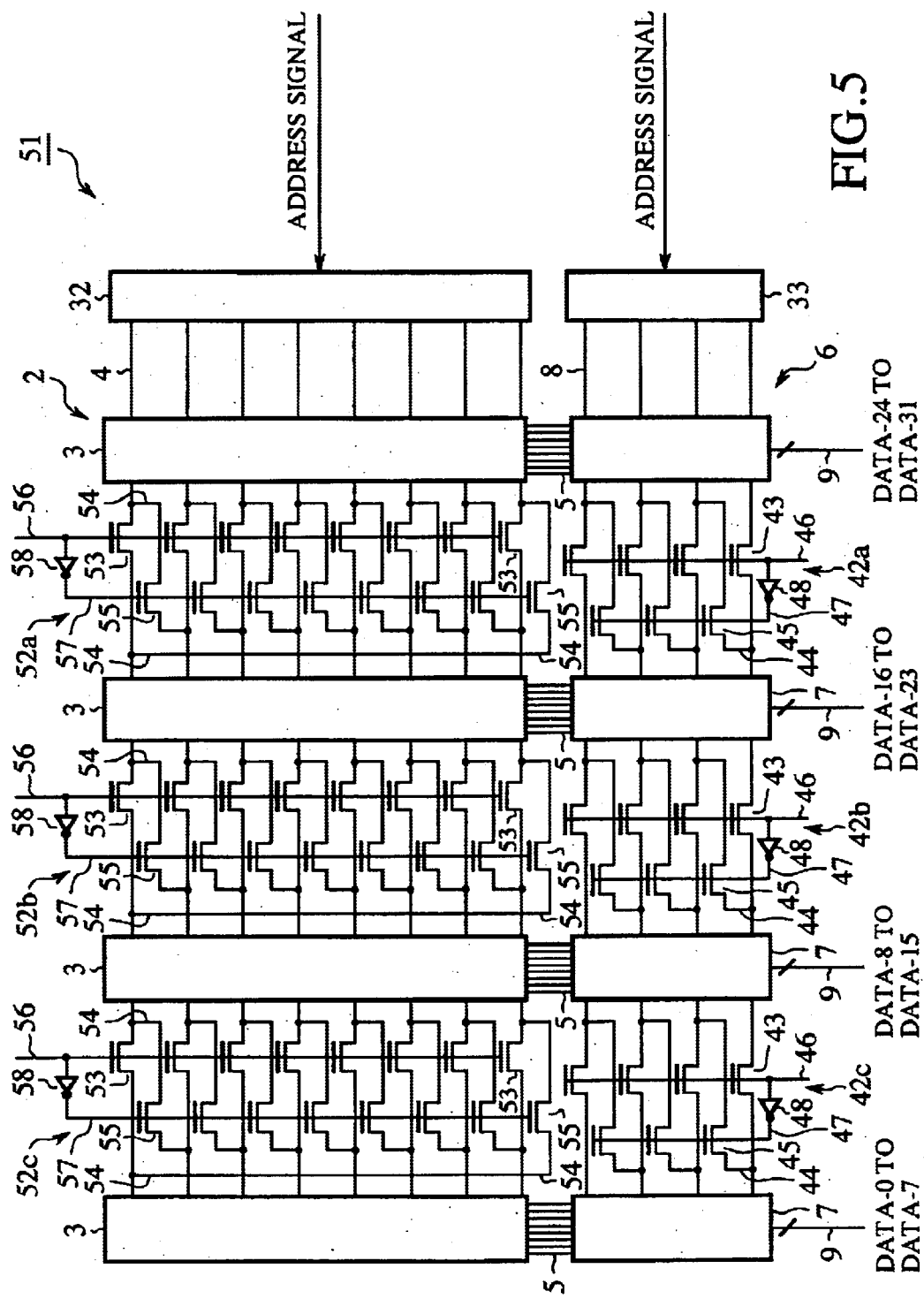
FIG. 5 is a block diagram showing the configuration of a semiconductor storing device according to a fifth embodiment of the present invention.

FIG. 5 is a block diagram showing the configuration of a semiconductor storing device according to a fifth embodiment of the present invention. The constituent elements, which are the same as those shown in FIG. 4, are indicated by the same reference numerals as those of the constituent elements shown in FIG. 4, and additional description of those constituent elements is omitted.

In a fifth embodiment, a semiconductor storing device has word line changing circuits similar to the word line changing circuits 34a to 34c of the third embodiment and the bit line changing circuits (or the bit line control unit) 42a to 42c of the fourth embodiment.

In FIG. 5, in the same manner as in the first embodiment, the addresses are assigned to the memory cells 16 (refer to FIG. 1B) of the memory cell array 2 according to the first addressing arrangement shown in FIG. 10. 51 indicates a semiconductor storing device. 52a indicates a first word line changing circuit (or a word line changing unit) connected with the group of word lines 4 of the first memory cell block 3 nearest to the row address decoder 32 and the group of word lines 4 of the second memory cell block 3. 52b indicates a second word line changing circuit (or the word line changing unit) connected with the group of word lines 4 of the second memory cell block 3 and the group of word lines 4 of the third memory cell block 3. 52c indicates a third word line changing circuit (or the word line changing unit) connected with the group of word lines 4 of the third memory cell block 3 and the group of word lines 4 of the fourth memory cell block 3. Each of the word line changing circuits 52a to 52d is composed of a plurality of first NMOS transistors 53 in which source electrodes and drain electrodes are connected with the word lines 4 in one-to-one correspondence,.a plurality of auxiliary word lines 54 respectively connecting the input end of the first NMOS transistor 53 of one word line 4 of a first address group and the output end of the first NMOS transistor 53 of another word line 4 of a specific address group on condition that the specific address group is higher than the first address group and is nearest to the first address group among address groups of the all the word lines 4, another auxiliary word line 54 connecting the input end of the first NMOS transistor 53 connected with the word line 4 of the bottom and the output end of the first NMOS transistor 53 connected with the word line 4 of the top, a plurality of second NMOS transistors 55 in which source electrodes and drain electrodes are connected with the auxiliary word lines 54 in one-to-one correspondence, a first control signal line 56 connected with gate electrodes of the first NMOS transistors 53, a second control signal line 57 connected with gate electrodes of the second NMOS transistors 55, and an NOT circuit 58 connecting the first control signal line 56 and the second control signal line 57. A control signal input to each first control signal line 56 is inverted into an inverted control signal in the corresponding NOT circuit 58, and the inverted control signal is input to the gate electrodes of the corresponding second NMOS transistors 55 through the corresponding second control signal line 57. In this embodiment, each auxiliary word line 54 connected with the input end of the first NMOS transistor 53 of one word line 4 different from the bottom word line 4 is connected with one pair of word lines 4 adjacent to each other.

Next, an operation of the semiconductor storing device 51 will be described.

An operation of reading out or writing 32-bit data corresponding to the 32-bit width of the memory cell array 2 in the row direction from/in thirty-two memory cells 16, to which addresses ranging from the address "01" to the address "04" are assigned, will be initially described. The top memory cell 16 among the memory cells 16 of the address "01" is placed in the middle of the memory cells 16 of the first row.

In this case, an L signal of a low level is input to the first control signal line 56 of the third word line changing circuit 52c to turn off the NMOS transistors 53 of the third word line changing circuit 52c and to turn on the NMOS transistors 55 of the third word line changing circuit 52c, and an H signal of a high level is input to the first control signal lines 56 of the other word line changing circuits 52a and 52b to turn on the NMOS transistors 53 of the other word line changing circuits 52a and 52b and to turn off the NMOS transistors 55 of the other word line changing circuits 52a and 52b. Also, the H signal is input to the first control signal lines 46 of the first, second and third bit line changing circuits 42a and 42b. Therefore, a word line 4 selected in the row address decoder 32 can be set to an active state in the first, second and third memory cell blocks 3 placed on the side of the row address decoder 32 from the third word line changing circuit 52c. Also, in cases where one word line 4 different from the word line 4 of the bottom is selected in the row address decoder 32, a specific word line 4 corresponding to a specific address group, which is higher than an address group of the word line 4 selected in the row address decoder 32 and is nearest to the address group of the selected word line 4 among address groups of all the word lines 4, can be set to an active state in the fourth memory cell block 3 placed on the opposite side of the row address decoder 32 from the third word line changing circuit 52c. Also, a plurality of bit lines 5 selected in the bit selectors 17 of the bit selector blocks 7 according to a bit select line 8 selected in the column address decoder 33 can be set to an active state.

Thereafter, the first word line 4 from the top is selected in the row address decoder 32, and the first bit select line 8 from the top is selected in the column address decoder 33 to make the bit selectors 17 of all the bit selector blocks 7 select the first bit lines 5 from the left. Therefore, the first word line 4 from the top is set to an active state in the first, second and third memory cell blocks 3, the second word line 4 from the top is set to an active state in the fourth memory cell block 3, and the first bit lines 5 from the left are respectively set to an active state in all the bit selector blocks 7. In other words, the first word line 4 and the first bit lines 5 connected with twenty-four memory cells 16 of the addresses "01" to "03" in the first, second and third memory cell blocks 3 are respectively set to an active state, the second word line 4 and the first bit lines 5 connected with eight memory cells 16 of the address "04" in the fourth memory cell block 3 (or the remaining memory cell block 3) are respectively set to an active state, and thirty-two pieces of one-bit data are read out from or written in the thirty-two memory cells 16 of the addresses "01" to "04" as 32-bit data.

Accordingly, 32-bit data can be read out from or written in the memory cell array 2 every access operation in case of the first addressing arrangement.

Next, an operation of reading out or writing 32-bit data corresponding to the 32-bit width of the memory cell array 2 in the row direction from/in thirty-two memory cells 16, to which addresses starting from the address "1D" and ending to the address "20" are assigned, will be described.

The eight memory cells 16 of the address "1D" is connected with both the first bit line 5 from the left and the word line 4 of the bottom in the third memory cell block 3. Therefore, the top memory cell 16 among the memory cells 16 of the address "1D" is placed in the middle of the memory cells 16 of the eighth row. The eight memory cells 16 of the address "1E" is connected with both the first bit line 5 from the left and the word line 4 of the bottom in the second memory cell block 3. The eight memory cells 16 of the address "1F" is connected with both the first bit line 5 from the left and the word line 4 of the bottom in the first memory cell block 3. The eight memory cells 16 of the address "20" is connected with both the second bit line 5 from the left and the first word line 4 from the top in the fourth memory cell block 3.

In this operation, the L signal is input to the first control signal line 56 of the third word line changing circuit 52c, and the H signal is input to the first control signal lines 56 of the other word line changing circuits 52a and 52b. Also, the L signal is input to the first control signal line 46 of the third bit line changing circuit 42c, and the H signal is input to the first control signal lines 46 of the first and second bit line changing circuits 42a and 42b. Therefore, a word line 4 selected in the row address decoder 32 can be set to an active state in the first, second and third memory cell blocks 3 placed on the side of the row address decoder 32 from the third word line changing circuit 52c. Also, in cases where the word line 4 of the bottom is selected in the row address decoder 32, the first word line 4 from the top can be set to an active state in the fourth memory cell block 3 placed on the opposite side of the row address decoder 32 from the third word line changing circuit 52*c*. Also, a plurality of bit lines 5 selected in the bit selectors 17 of the first, second and third bit selector blocks 7 according to a bit select line 8 selected in the column address decoder 33 can be set to an active state. Also, in each bit selector 17 of the fourth bit selector block 7 placed on the opposite side of the column address decoder 33 from the third bit line changing circuit 42*c*, a specific bit line 5 corresponding to an address group, which is higher than an address group of the bit line 5 corresponding to the bit select line 8 selected in the column address decoder 33 and is nearest to the address group of the bit line 5 among address groups of all the bit lines 5 of the bit selector 17, can be set to an active state.

Thereafter, the word line 4 of the bottom (that, the eighth word line 4 from the top) is selected in the row address decoder 32, and the first bit select line 8 from the top is selected in the column address decoder 33. Therefore, the word line 4 of the bottom is set to an active state in the first, second and third memory cell blocks 3, the first word line 4 from the top is set to an active state in the fourth memory cell block 3. Also, the first bit lines 5 from the left are selected in the bit selectors 7 of the first, second and third bit selector blocks 7 and are respectively set to an active state, and the second bit lines 5 from the left are selected in the bit selectors 7 of the fourth bit selector block 7 and are respectively set to an active state. In other words, the word line 4 of the bottom and the first bit lines 5 connected with twenty-four memory cells 16 of the addresses "1D", "1E" and "1F" in the first, second and third memory cell blocks 3 are respectively set to an active state, the first word line 4 and the first bit lines 5 connected with eight memory cells 16 of the address "20" in the fourth bit selector block 7 (or the remaining bit selector block 7) are respectively set to an active state, and thirty-two pieces of one-bit data are read out from or written in the thirty-two memory cells 16 of the addresses "1D" to "20" as 32-bit data.

Accordingly, 32-bit data can be read out from or written in the memory cell array 2 every access operation in case of the first addressing arrangement.

As is described above, in the fifth embodiment, the memory cell array 2 is divided into the memory cell blocks 3 respectively having the 8-bit width in the row direction, the bit selector array 6 is divided into the bit selector blocks 7, each bit selector block 7 has the bit selectors 17 of which the number is equal to eight corresponding to the 8-bit width of the corresponding memory cell block 3. Also, each of the word line changing circuits 52*a* to 52*c* is connected with the word lines 4 extending from the memory cell blocks 3 adjacent to each other, and each of the bit line changing circuits. 42*a* to 42*c* is connected with the bit select lines 8 extending from the bit selector blocks 7 adjacent to each other. In cases where the word line 4 different from the bottom word line 4 is selected in the row address decoder 32, by using the word line changing circuits 52*a* to 52*c* and the bit line changing circuits 42*a* to 42, the bit lines 5 corresponding to the bit select line 8 selected in the column address decoder 33 are respectively set to an active state in all the memory cell blocks, the word line 4 selected in the row address decoder 32 is set to an active state in one memory cell block 3 or a plurality of memory cell blocks 3 placed on the side of the row address decoder 32, and a specific word line 4 corresponding to a specific address group, which is higher than an address group of the word line 4 selected in the row address decoder 32 and is nearest to the address group of the selected word line 4 among address groups of all the word lines 4, is set to an active state in the remaining memory cell block 3 or the remaining memory cell blocks 3.

Also, in cases where the word line 4 of the bottom is selected in the row address decoder 32, the word line 4 of the bottom and the bit line 5 corresponding to the bit select line 8 selected in the column address decoder 33 are respectively set to an active state in one memory cell block 3 or a plurality of memory cell blocks placed on the side of the row address decoder 32, the word line 4 of the top is set to an active state in the remaining memory cell block 3 or the remaining memory cell blocks 3, and a specific bit line 5 of an address group, which is higher than an address group of the bit line 5 corresponding to the bit select line 8 selected in the column address decoder 33 and is nearest to the address group of the bit line 5 among address groups of all the bit lines 5, is set to the active state in each bit selector 17 corresponding to the remaining memory cell block(s) 3.

Therefore, pieces of data corresponding to the bit width of the memory cell array 2 can be read out from or written in a plurality of memory cells 16 of the memory cell array 2 in one access operation even though the top memory cell 16 placed at the top among the memory cells 16 is placed in the middle of a row of memory cells.

Also, even though the memory cell 16 relating to the top one-bit data of the data is connected with the word line 8 of the bottom, the data corresponding to the bit width of the memory cell array 2 can be read out from or written in the memory cell array 2 in one access operation.

Embodiment 6

Figure 6:
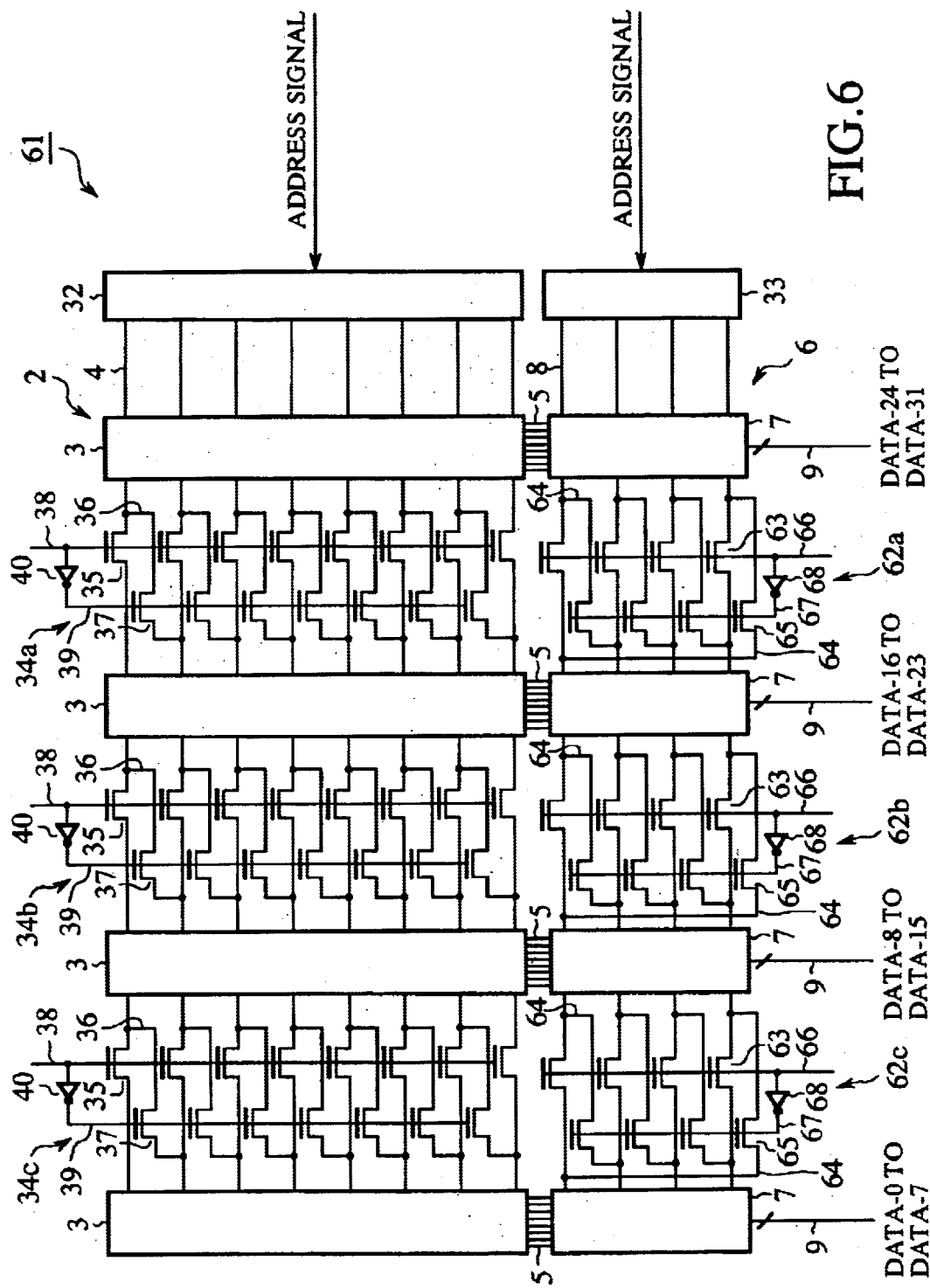
FIG. 6 is a block diagram showing the configuration of a semiconductor storing device according to a sixth embodiment of the present invention.

FIG. 6 is a block diagram showing the configuration of a semiconductor storing device according to a sixth embodiment of the present invention. The constituent elements, which are the same as those shown in FIG. 3, are indicated by the same reference numerals as those of the constituent elements shown in FIG. 3, and additional description of those constituent elements is omitted.

In a sixth embodiment, a semiconductor storing device has the word line changing circuits (or the word line changing unit) 34*a* to 34*c* of the third embodiment and the bit line changing circuits similar to the bit line changing circuits 42*a* to 42*c* of the fourth embodiment. Also, in the same manner as in the fourth embodiment, N=4 is satisfied.

In FIG. 6, in the same manner as in the second embodiment, the addresses are assigned to the memory cells 16 (refer to FIG. 1B) of the memory cell array 2 according to the second addressing arrangement shown in FIG. 11. 61 indicates a semiconductor storing device. 62*a* indicates a first bit line changing circuit (or a bit line control unit) connected with the group of bit select lines 8 of the first bit selector block 7 and the group of bit select lines 8 of the second bit selector block 7. 62*b* indicates a second bit line changing circuit (or the bit line control unit) connected with the group of bit select lines 8 of the second bit selector block 7 and the group of bit select lines 8 of the third bit selector block 7. 62*c* indicates a third bit line changing circuit (or the bit line control unit) connected with the group of bit select lines 8 of the third bit selector block 7 and the group of bit select lines 8 of the fourth bit selector block 7. Each of the bit line changing circuits 62*a* to 62*c* is composed of a plurality of first NMOS transistors 63 in which source electrodes and drain electrodes are connected with the bit select lines 8 in one-to-one correspondence, a plurality of auxiliary word lines 64 respectively connecting the input end of the first NMOS transistor 63 of one bit select line 8 corresponding to one bit line 5 of a first address group in one bit selector 17 and the output end of the first NMOS transistor 63 of another bit select line 8 corresponding to another bit line 5 of a specific address group in the bit selector 17 on condition that the specific address group is higher than the first address group and is nearest to the first address group among address groups of all the bite lines 5 of the bit selector 17, another auxiliary word lines 64 connecting the input end of the first NMOS transistor 63 of the bit select line 8 placed at the bottom and the output end of the first NMOS transistor 63 of the bit select line 8 placed at the top, a second NMOS transistor 65 of which source electrodes and drain electrodes are connected with the auxiliary word lines 64 in one-to-one correspondence, a first control signal line 66 connected with gate electrodes of the first NMOS transistors 63, a second control signal line 67 connected with gate electrodes of the second NMOS transistors 65, and an NOT circuit 68 connecting the first control signal line 66 and the second control signal line 67. A control signal input to each first control signal line 66 is inverted into an inverted control signal in the corresponding NOT circuit 68, and the inverted control signal is input to the gate electrodes of the corresponding second NMOS transistors 65 through the corresponding second control signal line 67. In this embodiment, each auxiliary word line 64 connected with the input end of the first NMOS transistor 63 of one bit select line 8 different from the bit select line 8 of the bottom is connected with one pair of bit select lines 8 adjacent to each other.

Next, an operation of the semiconductor storing device 61 will be described.

An operation of reading out or writing 32-bit data corresponding to the 32-bit width of the memory cell array 2 in the row direction from/in thirty-two memory cells 16, to which addresses ranging from the address "01" to the address "04" are assigned, will be initially described. The top memory cell 16 among the memory cells 16 of the address "01" is placed in the middle of the memory cells 16 of the first row.

In this case, an L signal of a low level is input to the first control signal line 66 of the third bit line changing circuit 62*c*, and an H signal of a high level is input to the first control signal lines 66 of the first and second bit line changing circuits 62*a* and 62*b*. Also, the H signal is input to the first control signal lines 38 of the word line changing circuits 34*a* to 34*c*. Therefore, a plurality of bit lines 5 selected in the bit selectors 17 of the first, second and third bit selector blocks 7 according to a bit select line 8 selected in the column address decoder 33 can be set to an active state. Also, in cases where one bit select line 8 different from the bit select line 8 of the bottom is selected in the column address decoder 33, in each bit selector 17 of the fourth bit selector block 7 placed on the opposite side of the column address decoder 33 from the third bit line changing circuit 62*c*, a specific bit line 5 corresponding to an address group, which is higher than an address group of the bit line 5 corresponding to the bit select line 8 selected in the column address decoder 33 and is nearest to the address group of the bit line 5 among address groups of all the bit lines 5 of the bit selector 17, can be set to an active state. Also, a word line 4 selected in the row address decoder 32 can be set to an active state in the memory cell blocks 3.

Thereafter, the first bit select line 8 from the top is selected in the column address decoder 33 to select the first bit lines 5 from the left in the bit selectors 17 of the first, second and third bit selector blocks 7 and to select the second bit lines 5 from the left in the bit selectors 17 of the fourth bit selector block 7, and the first word line 4 from the top is selected in the row address decoder 32. Therefore, the first bit lines 5 from the left are respectively set to an active state in the first, second and third memory cell blocks 3, the second bit lines 5 from the left are respectively set to an active state in the fourth memory cell block 3, and the first word line 4 from the top is set to an active state in all the memory cell blocks 3. In other words, the first bit lines 5 from the left and the first word line 4 from the top connected with twenty-four memory cells 16 of the addresses "01" to "03" in the first, second and third memory cell blocks 3 are respectively set to an active state, the second bit lines 5 from the left and the first word line 4 from the top connected with eight memory cells 16 of the address "04" in the fourth memory cell block 3 (or the remaining memory cell block 3) are respectively set to an active state, and thirty-two pieces of one-bit data are read out from or written in the thirty-two memory cells 16 of the addresses "01" to "04" as 32-bit data.

Accordingly, 32-bit data can be read out from or written in the memory cell array 2 every access operation in case of the second addressing arrangement.

Next, an operation of reading out or writing 32-bit data corresponding to the 32-bit width of the memory cell array 2 in the row direction from/in thirty-two memory cells 16, to which addresses ranging from the address "0D" to the address "10" are assigned, will be described.

Because one of four bit lines 5 is selected in each bit selector 17 in case of N=4, the arrangement of the memory cells 16 of the addresses "0D", "0E", "0F" and "10" according to the second addressing arrangement is as follows. The eight memory cells 16 of the address "0D" is connected with both the first bit line 5 from the right (or the fourth bit line 5 from the left in case of N=4) and the first word line 4 from the top in the third memory cell block 3. Therefore, the top memory cell 16 among the memory cells 16 of the address "0D" is placed in the middle of the memory cells 16 of the first row. The eight memory cells 16 of the address "0E" is connected with both the first bit line 5 from the right and the first word line 4 from the top in the second memory cell block 3. The eight memory cells 16 of the address "0F" is connected with both the first bit line 5 from the right and the first word line 4 from the top in the first memory cell block 3. The eight memory cells 16 of the address "10" is connected with both the first bit line 5 from the left and the second word line 4 from the top in the fourth memory cell block 3.

In this operation, the L signal is input to the first control signal line 66 of the third bit line changing circuit 62*c*, and the H signal is input to the first control signal lines 66 of the first and second bit line changing circuits 62*a* and 62*b*. Also, the L signal is input to the first control signal line 38 of the word line changing circuits 34*c*, and the H signal is input to the first control signal lines 38 of the word line changing circuits 34*a* and 34*b*. Therefore, a plurality of bit lines 5 selected in the bit selectors 17 of the first, second and third bit selector blocks 7 according to a bit select line 8 selected in the column address decoder 33 can be set to an active state. Also, in cases where the bit select line 8 of the bottom is selected in the column address decoder 33, the first bit line 5 from the top can be selected in each bit selector 17 of the fourth bit selector block 7 placed on the opposite side of the column address decoder 33 from the third bit line changing circuit 62*c* to be set to an active state. Also, a word line 4 selected in the row address decoder 32 can be set to an active state in the first, second and third memory cell blocks 3, and a specific word line 4 corresponding to a specific address group, which is higher than an address group of a word line 4 selected in the row address decoder 32 and is nearest to the address group of the selected word line 4 among address groups of all the word lines 4, can be set to an active state in the fourth memory cell block 3 placed on the opposite side of the row address decoder 32 from the third word line changing circuit 34c.

Thereafter, the bit select line 8 of the bottom is selected in the column address decoder 33 to select the first bit lines 5 from the right in the bit selectors 17 of the first, second and third bit selector blocks 7 and to select the first bit lines 5 from the left in the bit selectors 17 of the fourth bit selector block 7, and the first word line 4 from the top is selected in the row address decoder 32. Therefore, the first bit lines 5 from the right and the first word line 4 from the top are respectively set to an active state in the first, second and third memory cell blocks 3, and the first bit lines 5 from the left and the second word line 4 from the top are respectively set to an active state in the fourth memory cell block 3. In other words, the first bit lines 5 from the right and the first word line 4 from the top connected with twenty-four memory cells 16 of the addresses "0D" to "0F" in the first, second and third memory cell blocks 3 are respectively set to an active state, the first bit lines 5 from the left and the second word line 4 from the top connected with eight memory cells 16 of the address "10" in the fourth memory cell block 3 (or the remaining memory cell block 3) are respectively set to an active state, and thirty-two pieces of one-bit data are read out from or written in the thirty-two memory cells 16 of the addresses "0D" to "10" as 32-bit data.

Accordingly, 32-bit data can be read out from or written in the memory cell array 2 every access operation in case of the second addressing arrangement.

As is described above, in the sixth embodiment, the memory cell array 2 is divided into the memory cell blocks 3 respectively having the 8-bit width in the row direction, the bit selector array 6 is divided into the bit selector blocks 7, each bit selector block 7 has the bit selectors 17 of which the number is equal to eight corresponding to the 8-bit width of the corresponding memory cell block 3. Also, each of the word line changing circuits 34a, to 34c is connected with the word lines 4 extending from the memory cell blocks 3 adjacent to each other, and, each of the bit line changing circuits 62a to 62c is connected with the bit select lines 8 extending from the bit selector blocks 7 adjacent to each other. In cases where one bit select line 8 different from the bit select line 8 of the bottom is selected in the column address decoder 33, by using the bit line changing circuits 62a to 62c and the word line changing circuits 34a to 34c, the word line 4 selected in the row address decoder 32 is set to an active state in all the memory cell blocks 3, the bit lines 5 corresponding to the bit select line 8 selected in the column address decoder 33 are respectively set to an active state in one memory cell block 3 or a plurality of memory cell blocks placed on the side of the row address decoder 32. Also, in each bit selector 17 corresponding to the remaining memory cell block 3 or the remaining memory cell blocks 3, a specific bit line 5 corresponding to an address group, which is higher than an address group of the bit line 5 corresponding to the bit select line 8 selected in the column address decoder 33 and is nearest to the address group of the bit line 5 among address groups of all the bit lines 5 of the bit selector 17, is set to an active state.

Also, in cases where the bit select line 8 of the bottom is selected in the column address decoder 33, the first bit lines 5 from the right and the word line 4 selected in the row address decoder 32 are respectively set to an active state in one memory cell block 3 or a plurality of memory cell blocks 3 placed on the side of the row address decoder 32, the first bit lines 5 from the left are respectively set to an active state in the remaining memory cell block 3 or the remaining memory cell blocks 3, and a specific word line 4 corresponding to a specific address group, which is higher than an address group of the word line 4 selected in the row address decoder 32 and is nearest to the address group of the selected word line 4 among address groups of all the word lines 4, is set to an active state in the remaining memory cell block 3 or the remaining memory cell blocks 3.

Therefore, pieces of data corresponding to the bit width of the memory cell array 2 can be read out from or written in a plurality of memory cells 16 of the memory cell array 2 in one access operation even though the top memory cell 16 placed at the top among the memory cells 16 is placed in the middle of a row of memory cells.

Also, even though the memory cell 16 relating to the top one-bit data of the data is connected with one first bit line 5 from the right, the data corresponding to the bit width of the memory cell array 2 can be read out from or written in the memory cell array 2 in one access operation.

Embodiment 7

In a seventh embodiment, a semiconductor storing device has word line changing circuits with combinational circuits.

Figure 7:
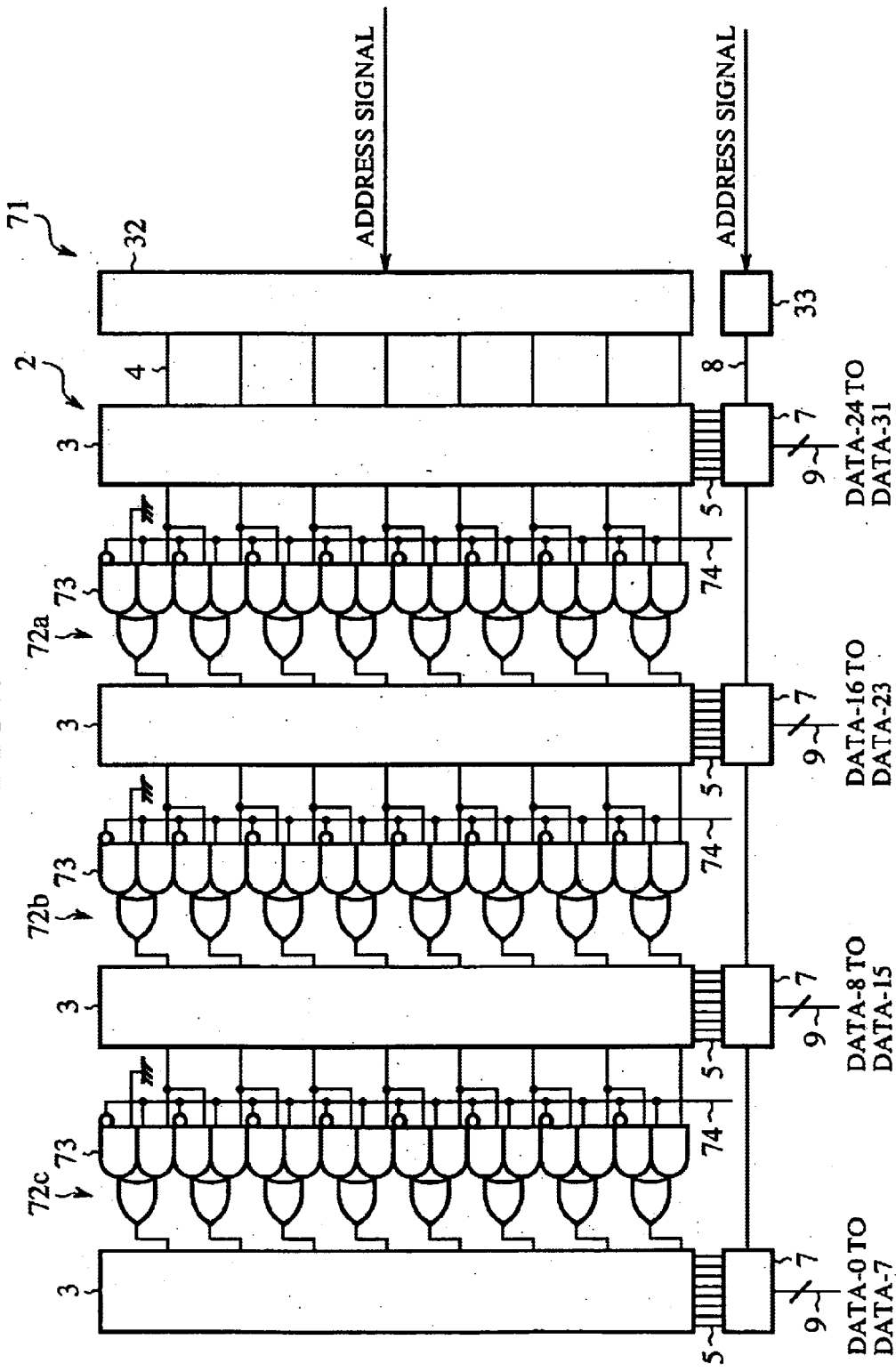
FIG. 7 is a block diagram showing the configuration of a semiconductor storing device according to a seventh embodiment of the present invention.
Figure 8A:
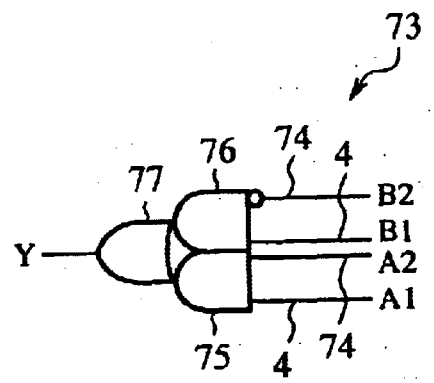
FIG. 8A is a view of each of combinational circuits disposed in the semiconductor storing device shown in FIG. 7.
Figure 8B:
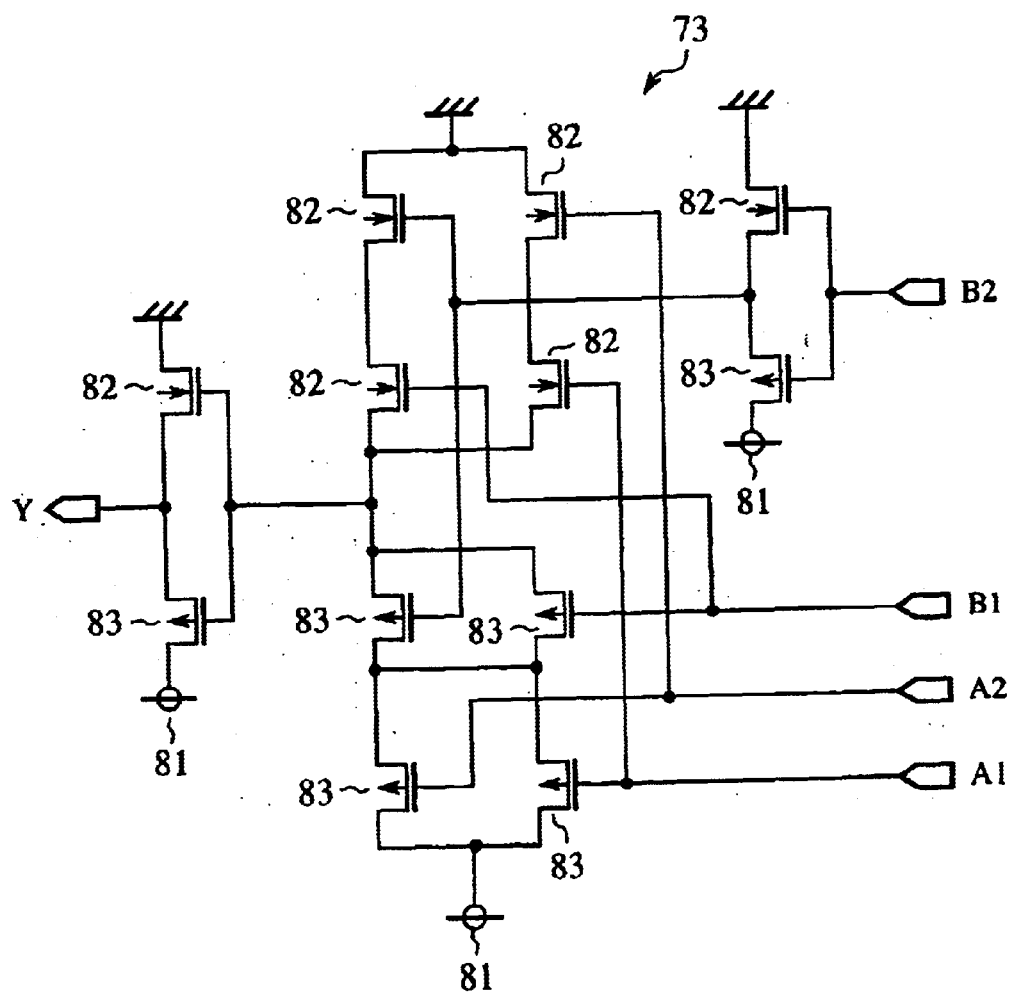
FIG. 8B is a circuit view of the combinational circuit composed of transistors.
Figure 9:
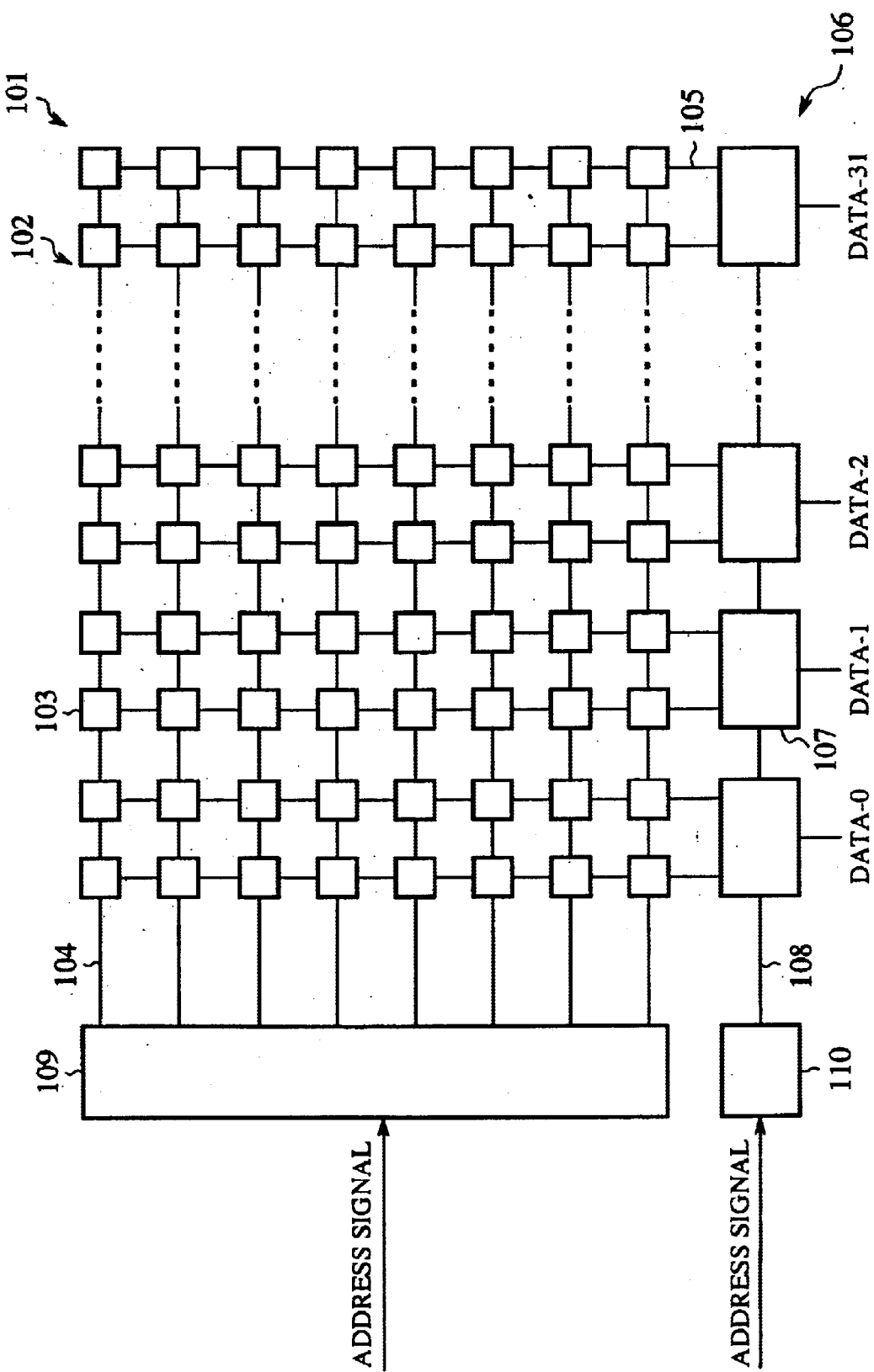
FIG. 9 is a block diagram showing the configuration of a conventional semiconductor storing device.

FIG. 7 is a block diagram showing the configuration of a semiconductor storing device according to a seventh embodiment of the present invention, FIG. 8A is a view of each of combinational circuits disposed in the semiconductor storing device shown in FIG. 7, and FIG. 8B is a circuit view of the combinational circuit composed of transistors.

The constituent elements, which are the same as those shown in FIG. 3, are indicated by the same reference numerals as those of the constituent elements shown in FIG. 3, and additional description of those constituent elements is omitted.

In FIG. 7, in the same manner as in the first embodiment, the addresses are assigned to the memory cells 16 (refer to FIG. 1B) of the memory cell array 2 according to the first addressing arrangement shown in FIG. 10. 71 indicates a semiconductor storing device. 72a indicates a first word line changing circuit connected with the group of word lines 4 of the first memory cell block 3 and the group of word lines 4 of the second memory cell block 3. 72b indicates a second word line changing circuit connected with the group of word lines 4 of the second memory cell block 3 and the group of word lines 4 of the third memory cell block 3. 72c indicates a third word line changing circuit connected with the group of word lines 4 of the third memory cell block 3 and the group of word lines 4 of the fourth memory cell block 3. Each of the word line changing circuits 72a to 72d is composed of a combinational circuit 73 disposed for each word line 4 and a control signal line 74 connected with each combinational circuit 73. As shown in FIG. 8A, each combinational circuit 73 is composed of a first AND gate 75, a second AND gate 76 used as an inhibit gate and an OR gate 77. A signal A1 of one word line 4 of a higher address group (or the L-th word line 4 from the top, L denotes an integral number ranging from 1 to 8) and a signal A2 of the control signal line 74 are input to the first AND gate 75. A signal B1 of one word line 4 of a lower address group (or the (L−1)-th word line 4 from the top, L is limited to the integral number ranging from 1 to 7) adjacent to the word line 4 of the higher address group and an inverted signal of the signal B2 of the control signal line 74 are input to the second AND gate 76. A signal output from the first AND gate 75 and a signal output from the second AND gate 76 are input to the OR gate 77, and an output signal Y of the OR gate 77 is input to the L-th word line 4 connected with the following memory cell block 3. Here, no signal B1 is received in an input terminal of the second AND gate 76 combined with the first AND gate 75 receiving the signal A1 of the first word line 4 from the top, but the input terminal of the second AND gate 76 is grounded.

In FIG. 8B, 81 indicates each of electric power sources. 82 indicates each of NMOS transistors. 83 indicates each of PMOS transistors. Each combinational circuit 73 is composed of three electric power sources 81, six NMOS transistors 82 and six PMOS transistors 83. Because electric power is supplied to the combinational circuit 73, a voltage level of the output signal Y of the OR gate 77 is set to a high constant level or a low constant level.

When an L signal of a low level is input to the control signal line 74 of one of the word line changing circuits 72a to 72c, only a case where the word line 4 of the lower address group is set to an active state so as to set the signal B1 to a high level, the output signal Y of the OR gate 77 is set to a high level. Therefore, the L-th word line 4 connected with the output end of the word line changing circuit is set to an active state in cases where the (L−1)-th word line 4 connected with the input end of the word line changing circuit is set to an active state.

Also, when an H signal of a high level is input to the control signal line 74 of one of the word line changing circuits 72a to 72c, only a case where the word line 4 of the higher address group is set to an active state so as to set the signal A1 to a high level, the output signal Y of the OR gate 77 is set to a high level. Therefore, the L-th word line 4 connected with the output end of the word line changing circuit is set to an active state in cases where the L-th word line 4 connected with the input end of the word line changing circuit is set to an active state.

Next, an operation of the semiconductor storing device 71 will be described.

In a first example, the L signal is input to the control signal line 74 of the first word line changing circuit 72a, and the H signal is input to the control signal lines 74 of the second and third word line changing circuits 72b and 72c. In cases where an L-th word line 8 (L=1 to 7) from the top is selected in the row address decoder 32, the L-th word line 8 is set to an active state in the first memory cell block 3, and the (L+1)-th word line 8 is set to an active state in the second, third and fourth memory cell blocks 3.

In a second example, the L signal is input to the control signal line 74 of the second word line changing circuit 72b, and the H signal is input to the control signal lines 74 of the first and third word line changing circuits 72a and 72c. In cases where an L-th word line 8 from the top is selected in the row address decoder 32, the L-th word line 8 is set to an active state in the first and second memory cell blocks 3, and the (L+1)-th word line 8 is set to an active state in the third and fourth memory cell blocks 3.

In a third example, the L signal is input to the control signal line 74 of the second word line changing circuit 72c, and the H signal is input to the control signal lines 74 of the first and third word line changing circuits 72a and 72b. In cases where an L-th word line 8 from the top is selected in the row address decoder 32, the L-th word line 8 is set to an active state in the first, second and third memory cell blocks 3, and the (L+1)-th word line 8 is set to an active state in the fourth memory cell block 3.

Therefore, the semiconductor storing device 71 is operated in the same manner as the operation of the semiconductor storing device 31 of the third embodiment.

As is described above, in the seventh embodiment, each of the word line changing circuits 72a to 72c is disposed between the memory cell blocks 3 adjacent to each other. Accordingly, data corresponding to the bit width of the memory cell array 2 can be read out from or written in the memory cell array 2 in one access operation even though top one-bit data of the data is read out from or written in a memory cell 16 placed in the middle of a row of memory cells 16.

Also, because electric power is supplied to each combinational circuit 73 of the word line changing circuits 72a to 72c, a voltage level of each output signal of the word line changing circuits 72a to 72c can be constant and stable.

In the seventh embodiment, each word line changing circuit composed of the combinational circuits 73 is disposed between the memory cell blocks 3 adjacent to each other. However, it is applicable that a bit line changing circuit composed of the combinational circuits 73 be disposed between each pair of bit selector blocks 7 adjacent to each other.

Also, in the first to seventh embodiments, the memory cell array 2 is divided into four. However, it is applicable that the memory cell array 2 be divided into a plurality of memory cell blocks 3 of which the number is not equal to 4.

Also, in the first to seventh embodiments, each memory cell block 3 has the 8-bit width. However, it is applicable that each memory cell block 3 have a bit width other than 8.

What is claimed is:

1. A semiconductor storing device comprising:

a memory cell array having a plurality of memory cells disposed in a matrix which is composed of a plurality of columns respectively extending in a column direction and a plurality of rows respectively extending in a row direction from a first column position to a second column position, a plurality of addresses being assigned to the memory cells in one-to-one correspondence;

a plurality of memory cell blocks disposed in parallel to each other in the row direction, each memory cell block having the memory cells of a group of columns to have a prescribed bit width in the row direction;

a plurality of word lines respectively connected with the memory cells of the memory cell array placed in one row;

a plurality of bit lines respectively connected with the memory cells of the memory cell array placed in one column;

a first row address decoder for selecting one word line from the word lines according to a first row address signal;

a second row address decoder for selecting one word line corresponding to a specific address group, which is higher than an address group of the word line selected by the first row address decoder and is nearest to the address group of the word line among address groups of the word lines, from the word lines according to a second row address signal; and a word line control unit for controlling the word line selected by the first row address decoder to be set to an active state in one memory cell block or memory cell blocks placed on the side of the second column position and controlling the word line selected by the second row address decoder, in the remaining memory cell block or the remaining memory cell blocks or no remaining memory cell block placed on the side of the first column position, to be set to an active state.

2. A semiconductor storing device according to claim 1, wherein the word line control unit comprises a plurality of word line control circuits respectively connected with the word lines which connect one pair of memory cell blocks adjacent to each other or connect the second row address decoder and the memory cell block adjacent to the second row address decoder, and each word line control circuit comprises a plurality of MOS transistors connected with the word lines in one-to-one correspondence and a control signal line connected with gate electrodes of the MOS transistors.

3. A semiconductor storing device according to claim 1, wherein the assignment of the addresses to the memory cells is performed so as to consecutively increase the address in the row direction in each row.

4. A semiconductor storing device comprising:
a memory cell array having a plurality of memory cells disposed in a matrix which is composed of a plurality of columns respectively extending in a column direction and a plurality of rows respectively extending in a row direction from a first column position to a second column position, a plurality of addresses being assigned to the memory cells in one-to-one correspondence;
a plurality of memory cell blocks disposed in parallel to each other in the row direction, each memory cell block having the N memory cells. (N denotes an integral number equal to or higher than two) for each row;
a plurality of word lines respectively connected with the memory cells of the memory cell array placed in one row;
a row address decoder for selecting one of the word lines according to a row address signal;
a plurality of bit lines respectively connected with the memory cells of the memory cell array placed in one column;
a plurality of bit select lines of which the number is equal to N and which are related to the bit lines of each memory cell block in one-to-one correspondence;
a first column address decoder for selecting one bit select line from the bit select lines according to a first column address signal;
a second column address decoder for selecting one bit select line corresponding to one bit line of a specific address group, which is higher than an address group of the bit line corresponding to the bit select line selected by the first column address decoder and is nearest to the address group of the bit line among address groups of the bit lines of one memory cell block, according to a second column address signal;
a plurality of bit selectors, disposed in correspondence to the memory cell blocks respectively and connected with the bit select lines, for respectively selecting one bit line corresponding to one bit select line in the corresponding memory cell block; and
a bit line control unit for controlling one bit selector or each of bit selectors corresponding to one memory cell block or each of memory cell blocks placed on the side of the second column position to select the bit line corresponding to the bit select line selected by the first column address decoder and controlling one bit selector or each of bit selectors or no bit selector corresponding to the remaining memory cell block or each of the remaining memory cell blocks or no remaining memory cell block placed on the side of the first column position to select the bit line corresponding to the bit select line selected by the second column address decoder.

5. A semiconductor storing device according to claim 4, wherein the bit line control unit comprises a plurality of bit line control circuits respectively connected with the bit selecting lines which connect one pair of bit selectors corresponding to one pair of memory cell blocks adjacent to each other or connect the second column address decoder and the bit selector adjacent to the second column address decoder, and each bit line control circuit comprises a plurality of MOS transistors connected with the bit select lines in one-to-one correspondence and a control signal line connected with gate electrodes of the MOS transistors.

6. A semiconductor storing device according to claim 4, wherein the assignment of the addresses to the memory cells is performed on condition that a group of addresses assigned to one group of memory cells of the bit lines corresponding to each bit select line in each row are increased with the change of the group of memory cells in the row direction, the address is consecutively increased in the row direction in each group of memory cells for each row and the addresses of consecutive numbers are assigned to the memory cells of each row.

7. A semiconductor storing device comprising:
a memory cell array having a plurality of memory cells disposed in a matrix which is composed of a plurality of columns respectively extending in a column direction and a plurality of rows respectively extending in a row direction from a first column position to a second column position, a plurality of addresses being assigned to the memory cells in one-to-one correspondence;
a plurality of memory cell blocks disposed in parallel to each other in the row direction, each memory cell block having the memory cells of a group of columns to have a prescribed bit width in the row direction;
a plurality of word lines respectively connected with the memory cells of the memory cell array placed in one row;
a plurality of bit lines respectively connected with the memory cells of the memory cell array placed in one column;
a row address decoder for selecting one word line from the word lines according to a row address signal; and
a word line changing unit for setting the word line selected by the row address decoder to an active state in one memory cell block or memory cell blocks placed on the side of the second column position and changing the word line selected by the row address decoder, in the remaining memory cell block or the remaining memory cell blocks or no remaining memory cell block placed on the side of the first column position, to another word line corresponding to a specific address group, which is higher than an address group of the word line selected by the row address decoder and is nearest to the address group of the word line among address groups of the word lines, to set the changed word line to an active state.

8. A semiconductor storing device according to claim 7, wherein the word line changing unit comprises a plurality of word line changing circuits respectively connected with the word lines which connect one pair of memory cell blocks adjacent to each other, and each word line control circuit comprises a plurality of first MOS transistors connected with the word lines respectively, a plurality of auxiliary word lines respectively connecting an input end of the first MOS transistor connected with one word line and an output end of the first MOS transistor connected with another word line corresponding to a particular address group which is higher than an address group of the word line connected with the first MOS transistor and is nearest to the address group of the word line among the address groups of the word lines, a plurality of second MOS transistors connected with the auxiliary word lines respectively, a first control signal line connected with gate electrodes of the first MOS transistors, an NOT circuit for inverting a signal input to the first control signal line, and a second control signal line for inputting the signal inverted by the NOT circuit to gate electrodes of the second MOS transistors.

9. A semiconductor storing device according to claim 7, wherein the word line changing unit comprises a plurality of word line changing circuits respectively connected with the word lines which connect one pair of memory cell blocks adjacent to each other, each word line control circuit comprises a plurality of combinational circuits connected with the word lines in one-to-one correspondence and a control signal line connected with the combinational circuits, and each combinational circuit comprises a first AND circuit for receiving both a signal input to the word line corresponding to the combinational circuit and a signal input to the control signal line, a second AND circuit for receiving both a signal input to another word line corresponding to a particular address group, which is lower than an address group of the word line connected with the first AND circuit and is nearest to the address group of the word line among the address groups of the word lines, and a signal obtained by inverting the signal input to the control signal line, and an OR circuit for receiving both a signal output from the first AND circuit and a signal output from the second AND circuit and outputting a signal to the word line corresponding to the combinational circuit.

10. A semiconductor storing device according to claim 7, wherein the assignment of the addresses to the memory cells is performed so as to consecutively increase the address in the row direction in each row.

11. A semiconductor storing device comprising:
   a memory cell array having a plurality of memory cells disposed in a matrix which is composed of a plurality of columns respectively extending in a column direction and a plurality of rows respectively extending in a row direction from a first column position to a second column position, a plurality of addresses being assigned to the memory cells of the memory cell array in one-to-one correspondence;
   a plurality of memory cell blocks disposed in parallel to each other in the row direction, each memory cell block having the N memory cells (N denotes an integral number equal to or higher than two) for each row;
   a plurality of word lines respectively connected with the memory cells of the memory cell array placed in one row;
   a row address decoder for selecting one of the word lines according to a row address signal;
   a plurality of bit lines respectively connected with the memory cells of the memory cell array placed in one column;
   a plurality of bit select lines of which the number is equal to N and which are related to the bit lines of each memory cell block in one-to-one correspondence;
   a column address decoder for selecting one bit select line from the bit select lines according to a column address signal;
   a plurality of bit selectors, disposed in correspondence to the memory cell blocks respectively and connected with the bit select lines, for respectively selecting one bit line corresponding to one bit select line in the corresponding memory cell block;
   a bit line control unit for controlling one bit selector or each of bit selectors corresponding to one memory cell block or each of memory cell blocks placed on the side of the second column position to select the bit line corresponding to the bit select line selected by the column address decoder and to set the selected bit line to an active state, and controlling one bit selector or each of bit selectors or no bit selector corresponding to the remaining memory cell block or each of the remaining memory cell blocks or no remaining memory cell block placed on the side of the first column position to select one bit line of a specific address group, which is higher than an address group of the bit line corresponding to the bit select line selected by the column address decoder in the corresponding memory cell block and is nearest to the address group of the bit line among address groups of the bit lines of the corresponding memory cell block, from the bit lines of the corresponding memory cell block and to set the selected bit line to an active state; and
   a word line changing unit for
      (1) setting the word line selected by the row address decoder to an active state in the memory cell block or the memory cell blocks in which the bit line corresponding to the bit select line selected by the column address decoder is set to the active state by the bit line control unit,
      (2) changing the word line selected by the row address decoder, in the remaining memory cell block or the remaining memory cell blocks or no remaining memory cell block in which the bit line of the specific address group is set to the active state by the bit line control unit, to another word line corresponding to a specific address group, which is higher than an address group of the word line selected by the row address decoder and is nearest to the address group of the word line among address groups of the word lines, in a case where the word line selected by the row address decoder does not correspond to the highest address group among the address groups of the word lines,
      (3) changing the word line selected by the row address decoder, in the remaining memory cell block or the remaining memory cell blocks or no remaining memory cell block in which the bit line of the specific address group is set to the active state by the bit line control unit, to the word line corresponding to the lowest address group among the address groups of the word lines, in a case where the word line selected by the row address decoder corresponds to the highest address group among the address groups of the word lines, and
      (4) setting each of the changed word lines to an active state.

12. A semiconductor storing device according to claim 11, wherein the bit line control unit comprises a plurality of bit line changing circuits respectively connected with the bit select lines which connect one pair of bit selectors corresponding to one pair of memory cell blocks adjacent to each other, and each bit line changing circuit comprises a plurality of first MOS transistors connected with the bit select lines respectively, a plurality of auxiliary bit select lines respectively connecting an input end of the first MOS transistor connected with one bit select line and an output end of the first MOS transistor connected with another bit select line corresponding to one bit line of a particular address group which is higher than an address group of the bit line corresponding to the bit select line connected with the first MOS transistor and is nearest to the address group of the bit line among the address groups of the bit lines corresponding to the bit select lines, a plurality of second MOS transistors connected with the auxiliary bit select lines respectively, a first control signal line connected with gate electrodes of the first MOS transistors, an NOT circuit for inverting a signal input to the first control signal line, and a second control signal line for inputting the signal inverted by the NOT circuit to gate electrodes of the second MOS transistors.

13. A semiconductor storing device according to claim 11, wherein the bit line control unit comprises a plurality of bit line changing circuits respectively connected with the bit select lines which connect one pair of bit selectors corresponding to one pair of memory cell blocks adjacent to each other, each bit line changing circuit comprises a plurality of combinational circuits connected with the bit select lines respectively and a control signal line connected with the combinational circuits, and each combinational circuit comprises a first AND circuit for receiving both a signal input to the bit select line corresponding to the combinational circuit and a signal input to the control signal line, a second AND circuit for receiving both a signal input to another bit select line corresponding to a bit line of a particular address group, which is lower than an address group of the bit line corresponding to the bit select line connected with the first AND circuit and is nearest to the address group of the bit line among the address groups of the bit lines corresponding to the bit select lines, and a signal obtained by inverting the signal input to the control signal line, and an OR circuit for receiving both a signal output from the first AND circuit and a signal output from the second AND circuit and outputting a signal to the bit select line corresponding to the combinational circuit.

14. A semiconductor storing device according to claim 11, wherein the word line changing unit comprises a plurality of word line changing circuits respectively connected with the word lines which connect one pair of memory cell blocks adjacent to each other, and each word line control circuit comprises a plurality of first MOS transistors connected with the word lines respectively, a plurality of auxiliary word lines respectively connecting an input end of the first MOS transistor connected with one word line not corresponding to the highest address group and an output end of the first MOS transistor connected with another word line corresponding to a particular address group which is higher than an address group of the word line connected with the first MOS transistor and is nearest to the address group of the word line among the address groups of the word lines, another auxiliary word line connecting an input end of the first MOS transistor connected with the word line corresponding to the highest address group and an output end of the first MOS transistor connected with the word line corresponding to the lowest address group, a plurality of second MOS transistors connected with the auxiliary word lines respectively, a first control signal line connected with gate electrodes of the first MOS transistors, an NOT circuit for inverting a signal input to the first control signal line, and a second control signal line for inputting the signal inverted by the NOT circuit to gate electrodes of the second MOS transistors.

15. A semiconductor storing device according to claim 11, wherein the assignment of the addresses to the memory cells is performed on condition that a group of addresses assigned to one group of memory cells of the bit lines corresponding to each bit select line in each row are increased with the change of the group of memory cells in the row direction, the address is consecutively increased in the row direction in each group of memory cells for each row and the addresses of consecutive numbers are assigned to the memory cells of the bit lines corresponding to each bit select line.

16. A semiconductor storing device comprising:
   a memory cell array having a plurality of memory cells disposed in a matrix which is composed of a plurality of columns respectively extending in a column direction and a plurality of rows respectively extending in a row direction from a first column position to a second column position, a plurality of addresses being assigned to the memory cells of the memory cell array in one-to-one correspondence;
   a plurality of memory cell blocks disposed in parallel to each other in the row direction, each memory cell block having the N memory cells (N denotes an integral number equal to or higher than two) for each row;
   a plurality of word lines respectively connected with the memory cells of the memory cell array placed in one row;
   a row address decoder for selecting one of the word lines according to a row address signal;
   a plurality of bit lines respectively connected with the memory cells of the memory cell array placed in one column;
   a plurality of bit select lines of which the number is equal to N and which are related to the bit lines of each memory cell block in one-to-one correspondence;
   a column address decoder for selecting one bit select line from the bit select lines according to a column address signal;
   a plurality of bit selectors, disposed in correspondence to the memory cell blocks respectively and connected with the bit select lines, for respectively selecting one bit line corresponding to one bit select line in the corresponding memory cell block;
   a word line changing unit for setting the word line selected by the row address decoder to an active state in one memory cell block or memory cell blocks placed on the side of the second column position and changing the word line selected by the row address decoder to another word line corresponding to a specific address group, which is higher than an address group of the word line selected by the row address decoder and is nearest to the address group of the word line among address groups of the word lines, to set the changed word line to an active state in the remaining memory cell block or the remaining memory cell blocks or no remaining memory cell block placed on the side of the first column position; and
   a bit line control unit for
      (1) controlling one bit selector or each of bit selectors corresponding to the memory cell block or each of the memory cell blocks, in which the word line selected by the row address decoder is set to the active state by the word line changing unit, to select the bit line corresponding to the bit select line selected by the column address decoder,
      (2) controlling one bit selector or each of bit selectors or no bit selector corresponding to the remaining memory cell block or each of the remaining memory cell blocks or no remaining memory cell block, in which the word line corresponding to the specific address group is set to the active state by the word line changing unit, to select one bit line of a specific address group, which is higher than an address group of the bit line corresponding to the bit select line selected by the column address decoder and is nearest to the address group of the bit line among address groups of the bit lines of the corresponding memory cell block, from the bit lines of the corresponding memory cell block, in a case where the bit select line selected by the column address decoder does not correspond to the bit line of the highest address group, and to select the bit line of the lowest address group from among the bit lines of the remaining memory cell block in a case where the bit select line selected by the column address decoder corresponds to the bit line of the highest address group, and (3) setting each of the selected bit lines of the memory cell blocks to an active state.

17. A semiconductor storing device according to claim 16, wherein the word line changing unit comprises a plurality of word line changing circuits respectively connected with the word lines which connect one pair of memory cell blocks adjacent to each other, and each word line control circuit comprises a plurality of first MOS transistors connected with the word lines respectively, a plurality of auxiliary word lines respectively connecting an input end of the first MOS transistor connected with one word line and an output end of the first MOS transistor connected with another word line corresponding to a particular address group which is higher than an address group of the word line connected with the first MOS transistor and is nearest to the address group of the word line among the address groups of the word lines, a plurality of second MOS transistors connected with the auxiliary word lines respectively, a first control signal line connected with gate electrodes of the first MOS transistors, an NOT circuit for inverting a signal input to the first control signal line, and a second control signal line for inputting the signal inverted by the NOT circuit to gate electrodes of the second MOS transistors.

18. A semiconductor storing device according to claim 16, wherein the word line changing unit comprises a plurality of word line changing circuits respectively connected with the word lines which connect one pair of memory cell blocks adjacent to each other, each word line control circuit comprises a plurality of combinational circuits connected with the word lines in one-to-one correspondence and a control signal line connected with the combinational circuits, and each combinational circuit comprises a first AND circuit for receiving both a signal input to the word line corresponding to the combinational circuit and a signal input to the control signal line, a second AND circuit for receiving booth a signal input to another word line corresponding to a particular address group, which is lower than an address group of the word line connected with the first AND circuit and is nearest to the address group of the word line among the address groups of the word lines, and a signal obtained by inverting the signal input to the control signal line, and an OR circuit for receiving both a signal output from the first AND circuit and a signal output from the second AND circuit and outputting a signal to the word line corresponding to the combinational circuit.

19. A semiconductor storing device according to claim 16, wherein the bit line control unit comprises a plurality of bit line changing circuits respectively connected with the bit select lines which connect one pair of bit selectors corresponding to one pair of memory cell blocks adjacent to each other, and each bit line changing circuit comprises a plurality of first MOS transistors connected with the bit select lines respectively, a plurality of auxiliary bit select lines respectively connecting an input end of the first MOS transistor connected with one bit select line, which does not corresponding to the highest address group, and an output end of the first MOS transistor connected with another bit select line corresponding to one bit line of a particular address group which is higher than an address group of the bit line corresponding to the bit select line connected with the first MOS transistor and is nearest to the address group of the bit line among the address groups of the bit lines corresponding to the bit select lines, another auxiliary bit select line connecting an input end of the first MOS transistor, which is connected with the bit select line corresponding to the highest address group, and an output end of the first MOS transistor connected with the bit select line corresponding to the lowest address group, a plurality of second MOS transistors connected with the auxiliary bit select lines respectively, a first control signal line connected with gate electrodes of the first MOS transistors, an NOT circuit for inverting a signal input to the first control signal line, and a second control signal line for inputting the signal inverted by the NOT circuit to gate electrodes of the second MOS transistors.

20. A semiconductor storing device according to claim 16, wherein the assignment of the addresses to the memory cells is performed on condition that a group of addresses assigned to one group of memory cells of the bit lines corresponding to each bit select line in each row are increased with the change of the group of memory cells in the row direction, the address is consecutively increased in the row direction in each group of memory cells for each row and the addresses of consecutive numbers are assigned to the memory cells of each row.

* * * * *